United States Patent
Lee et al.

(10) Patent No.: US 8,110,471 B2
(45) Date of Patent: Feb. 7, 2012

(54) SEMICONDUCTOR DEVICE HAVING A ROUND-SHAPED NANO-WIRE TRANSISTOR CHANNEL AND METHOD OF MANUFACTURING SAME

(75) Inventors: Sungyoung Lee, Yongin (KR); Dongsuk Shin, Yongin (KR)

(73) Assignee: Samsung Electronics Co., Ltd. (KR)

( * ) Notice: Subject to any disclaimer, the term of this patent is extended or adjusted under 35 U.S.C. 154(b) by 5 days.

(21) Appl. No.: 12/623,970

(22) Filed: Nov. 23, 2009

(65) Prior Publication Data

US 2010/0068862 A1 Mar. 18, 2010

Related U.S. Application Data

(62) Division of application No. 11/303,408, filed on Dec. 16, 2005, now Pat. No. 7,642,578.

(30) Foreign Application Priority Data

Mar. 24, 2005 (KR) .................. 10-2005-0024543

(51) Int. Cl.
*H01L 21/336* (2006.01)
(52) U.S. Cl. ................... 438/308; 257/E29.127
(58) Field of Classification Search .................. 257/288, 257/213, E29.127, E29.255
See application file for complete search history.

(56) References Cited

U.S. PATENT DOCUMENTS

| | | | |
|---|---|---|---|
| 5,583,362 A | 12/1996 | Maegawa | |
| 5,965,914 A | 10/1999 | Miyamoto | |
| 6,495,403 B1 | 12/2002 | Skotnicki et al. | |
| 6,635,923 B2 | 10/2003 | Hanafi et al. | |
| 6,835,614 B2 | 12/2004 | Hanafi et al. | |
| 6,855,606 B2 | 2/2005 | Chen et al. | |
| 6,919,250 B2 | 7/2005 | Krivokapic | |
| 7,002,207 B2 | 2/2006 | Kim et al. | |
| 7,229,884 B2 | 6/2007 | Park | |
| 7,274,051 B2 | 9/2007 | Kim et al. | |
| 7,435,665 B2 * | 10/2008 | Airaksinen et al. | 438/478 |
| 7,482,206 B2 | 1/2009 | Baik et al. | |
| 7,514,325 B2 | 4/2009 | Kim et al. | |
| 2002/0177263 A1 | 11/2002 | Hanafi et al. | |
| 2003/0186562 A1 * | 10/2003 | Fujimaki | 438/791 |
| 2004/0036128 A1 | 2/2004 | Zhang et al. | |
| 2004/0063286 A1 | 4/2004 | Kim et al. | |

(Continued)

FOREIGN PATENT DOCUMENTS

KR 10-2006-0022414 A 3/2006

(Continued)

OTHER PUBLICATIONS

Yang, Fu-Liang, et al., "5nm-Gate Nanowire FinFET," 2004 Symposium on VLSI Technology Digest of Technical Papers, pp. 196, 197.

(Continued)

*Primary Examiner* — Nathan Ha
(74) *Attorney, Agent, or Firm* — Onello & Mello, LLP

(57) ABSTRACT

A field-effect transistor (FET) with a round-shaped nanowire channel and a method of manufacturing the FET are provided. According to the method, source and drain regions are formed on a semiconductor substrate. A plurality of preliminary channel regions is coupled between the source and drain regions. The preliminary channel regions are etched, and the etched preliminary channel regions are annealed to form FET channel regions, the FET channel regions having a substantially circular cross-sectional shape.

77 Claims, 21 Drawing Sheets

U.S. PATENT DOCUMENTS

| | | | |
|---|---|---|---|
| 2004/0092067 A1 | 5/2004 | Hanafi et al. | |
| 2004/0166642 A1 | 8/2004 | Chen et al. | |
| 2005/0121706 A1 | 6/2005 | Chen et al. | |
| 2005/0233539 A1* | 10/2005 | Takeuchi et al. | 438/400 |
| 2005/0263821 A1 | 12/2005 | Cho et al. | |
| 2006/0049429 A1* | 3/2006 | Kim et al. | 257/213 |
| 2006/0073679 A1* | 4/2006 | Airaksinen et al. | 438/478 |
| 2006/0166456 A1 | 7/2006 | Fujiwara et al. | |
| 2006/0216897 A1 | 9/2006 | Lee et al. | |
| 2006/0246234 A1* | 11/2006 | Meyers et al. | 428/14 |
| 2010/0206216 A1* | 8/2010 | Fitzgerald et al. | 117/88 |
| 2010/0295046 A1* | 11/2010 | Yamazaki et al. | 257/57 |

FOREIGN PATENT DOCUMENTS

| | | |
|---|---|---|
| TW | 200417021 | 7/1992 |
| TW | 401643 | 8/2000 |
| TW | 541698 | 7/2003 |

OTHER PUBLICATIONS

"Semiconductor Device Having a Round-Shaped Nano-Wire Transistor Channel and Method of Manufacturing Same" Specification, Drawings, and Prosecution History of U.S. Appl. No. 11/303,408, filed Dec. 16, 2005, by Sungyoung Lee.

* cited by examiner

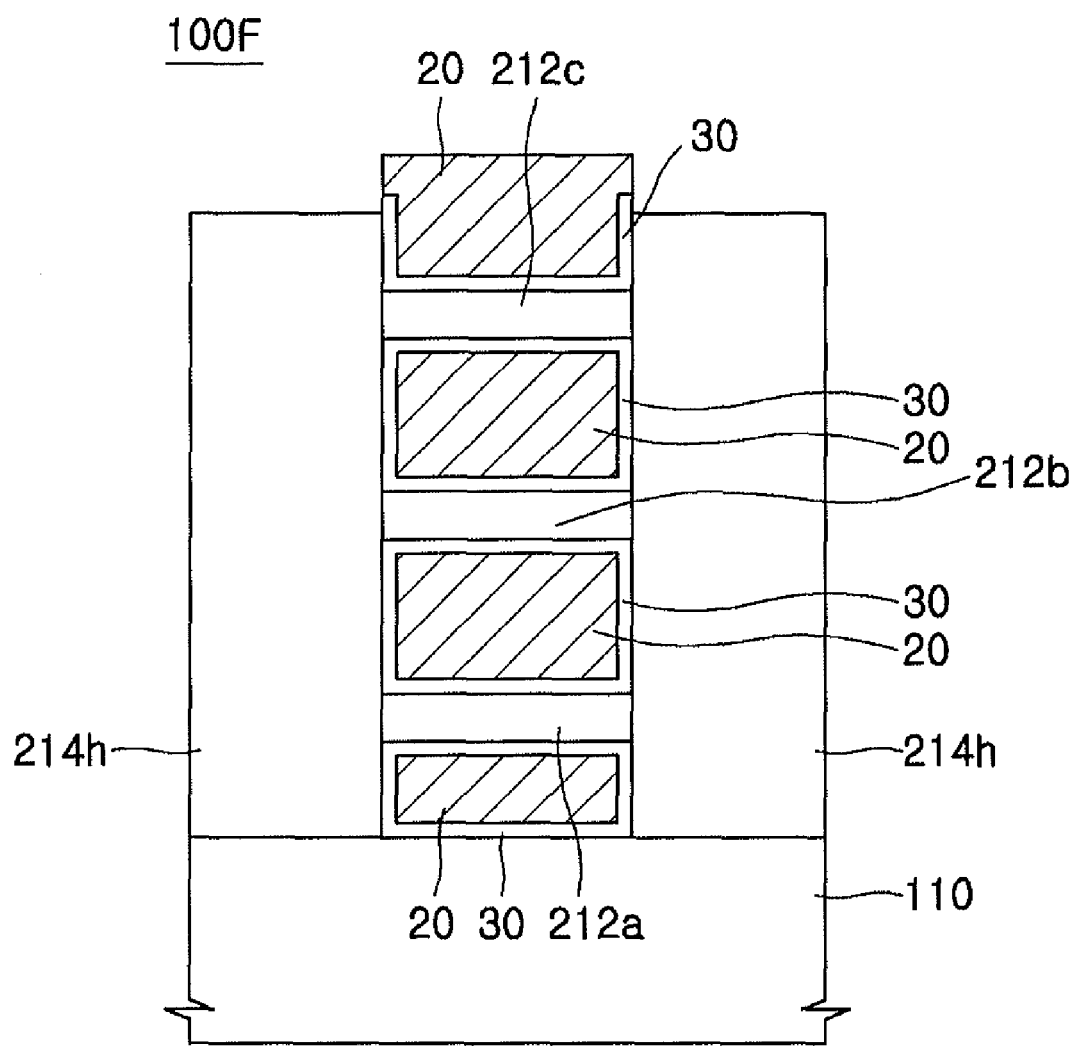

SEMICONDUCTOR DEVICE HAVING A ROUND-SHAPED NANO-WIRE TRANSISTOR CHANNEL AND METHOD OF MANUFACTURING SAME

RELATED APPLICATION

This application is a divisional application of the U.S. patent application Ser. No. 11/303,408, filed on Dec. 16, 2005, which claims the benefit of Korean patent application number 10-2005-0024543, filed on Mar. 24, 2005, in the Korean Intellectual Property Office, the contents of which applications are incorporated herein in their entirety by reference.

FIELD OF THE INVENTION

The invention relates to field-effect transistors (FETs) on semiconductor substrates and manufacturing methods thereof, and, more particularly, to a FET having a round-shaped, i.e., circular, nano-wire channel and a fabricating method thereof.

DESCRIPTION OF THE RELATED ART

As applications for semiconductor devices expand, highly-integrated and/or high-speed semiconductor devices are increasingly in demand. As integration density of semiconductor devices increases, a design rule becomes smaller. As a result of the decreasing design rule, a channel length and a channel width of a field effect transistor (FET) similarly decrease. A decrease in channel length may result in a short channel effect. A decrease in channel width may result in a narrow channel effect. The short channel effect may significantly influence potential in a source/drain region upon a channel region. The narrow channel width effect may generally increase a threshold voltage. However, in the case of a device using a STI (Shallow Trench Isolation), a channel width that is too narrow may decrease a threshold voltage. This is referred to as an inverse narrow width effect. In an attempt to prevent generation of the short channel effect and/or the narrow channel effect, various FETs having new structures have been proposed.

Recently, efforts have been made, particularly in the area of nano-size technology in the semiconductor field, to increase drive current of a transistor and decrease the short channel effect. Conventionally, several methods have been used in an effort to achieve these results. Examples of these attempts include a recessed channel array transistor (RCAT), a fin-type FET (FinFET), and gate-all-around transistor (GAT) technologies.

Each of these conventional devices and the corresponding methods of fabricating these devices, suffer from one of more disadvantages. For example, these conventional devices are limited in an ability to perform fast operations. Moreover, the number of spaced channel layers in these conventional devices is limited due to fabrication limitations, e.g., with respect to an etching depth that can be achieved during dry etching.

SUMMARY OF THE INVENTION

The present invention is therefore directed to a FET having one or more nano-wire channels and a method of manufacturing the FET, which substantially overcome one or more of the drawbacks due to the limitations and disadvantages of the prior art.

According to a first aspect, the invention is directed to a method of fabricating a field effect transistor (FET). According to the method, source and drain regions are formed on a semiconductor substrate. A plurality of preliminary channel regions are formed coupled between the source and drain regions. The preliminary channel regions are etched, and the etched preliminary channel regions are annealed to form FET channel regions, the FET channel regions having a substantially circular cross-sectional shape.

In one embodiment, the preliminary channel regions have a substantially rectangular cross-sectional shape. In one embodiment, the preliminary channel regions have corners in cross-section.

In one embodiment, the etching is performed in an atmosphere containing one or both of HCl and $H_2$. In one embodiment, a ratio of a flow rate of HCl to a flow rate of $H_2$ is from 3:7 to 1:1. In one particular embodiment, the ratio of flow rate of HCl to flow rate of $H_2$ is 3:5.

In one embodiment, the etching is performed at a temperature of 600 to 900 degrees C. The etching can be performed for a period of 1 to 120 seconds. The etching can be performed at a pressure of 10 to 100 Torr.

In one embodiment, the annealing is performed in an atmosphere containing $H_2$. The annealing can be performed with $H_2$ introduced at a flow rate of 1 to 500 sccm. The annealing can be performed at a temperature of 600 to 900 degrees C., and, more particularly, at a temperature of 810 degrees C. The annealing can be performed for a period of 10 to 800 seconds, and, more particularly, for a period of 500 seconds.

In one embodiment, the method further comprises, after forming the preliminary channel regions, cleaning the structure to remove oxide from the structure. The cleaning can be performed in an atmosphere containing at least one of $H_2$, Ar and He. The cleaning can be performed at a temperature of 600 to 900 degrees C. The cleaning can be performed at a gas flow rate of 1 to 500 sccm. The cleaning can be performed for a period of 1 to 5 minutes. The cleaning can be performed at a pressure of 0.1 to 10 Torr. In one embodiment, forming the plurality of preliminary channel regions comprises forming a channel layer and a sacrificial layer vertically adjacent to the channel layer. In one embodiment, the channel layer and the sacrificial layer are formed epitaxially. In one embodiment, the channel layer is a silicon layer. In one embodiment, the sacrificial layer is a SiGe layer.

In one embodiment, forming the plurality of preliminary channel regions further comprises trimming the channel layer to a desired dimension such that a front surface of at least one of the preliminary channel regions is offset with respect to a front surface of the source and drain regions in a direction normal to the front surface of the source and drain regions. The trimming can included etching the channel layer. Etching the channel layer can include a chemical dry etch.

In one embodiment, forming the plurality of preliminary channel regions further comprises forming a mask layer over the channel layer and sacrificial layer, the mask layer defining a region separating the FET channel regions.

In one embodiment, forming the plurality of preliminary channel regions comprises forming a plurality of sacrificial layers vertically adjacent to a channel layer. The sacrificial layers can comprise SiGe. An upper sacrificial layer can have a lower concentration of germanium than a lower sacrificial layer.

In one embodiment, the method further comprises purging a process chamber between etching the preliminary channel regions and annealing the etched preliminary channel regions.

In one embodiment, the etching and annealing steps are performed at least two times. In one embodiment, the method further comprises purging steps between a prior etching step and a next annealing step.

In one embodiment, the method further comprises forming a gate dielectric layer on the FET channel regions.

In one embodiment, the method further comprises forming a gate surrounding the FET channel regions. the gate can include polysilicon. Also, the gate comprises metal.

According to another aspect, the invention is directed to a method of fabricating a field effect transistor (FET). According to the method, at least one channel layer and at least one sacrificial layer are alternately stacked on a substrate. Source and drain regions are formed on the substrate coupled to the alternately stacked at least one channel layer and at least one sacrificial layer. The alternately stacked at least one channel layer and at least one sacrificial layer are patterned to form a plurality of preliminary channel regions coupled between the source and drain regions. A remaining portion of the at least one sacrificial layer is removed. The preliminary channel regions are etched, the etched preliminary channel regions are annealed to form FET channel regions, the FET channel regions having a substantially circular cross-sectional shape.

In one embodiment, the preliminary channel regions have a substantially rectangular cross-sectional shape. In one embodiment, the preliminary channel regions have corners in cross-section.

In one embodiment, the at least one channel layer and the at least one sacrificial layer are formed epitaxially.

In one embodiment, the at least one channel layer is a silicon layer. In one embodiment, the at least one sacrificial layer is a SiGe layer.

In one embodiment, forming the plurality of preliminary channel regions further comprises trimming the at least one channel layer to a desired dimension such that a front surface of at least one of the preliminary channel regions is offset with respect to a front surface of the source and drain regions in a direction normal to the front surface of the source and drain regions. In one embodiment, the trimming comprises etching the at least one channel layer. Etching the at least one channel layer can include a chemical dry etch.

In one embodiment, forming the plurality of preliminary channel regions further comprises forming a mask layer over the at least one channel layer and at least one sacrificial layer, the mask layer defining a region separating the FET channel regions.

In one embodiment, forming the plurality of preliminary channel regions comprise forming a plurality of sacrificial layers vertically adjacent to the channel layer.

The sacrificial layers can comprise SiGe. In one embodiment, an upper sacrificial layer has a lower concentration of germanium than a lower sacrificial layer.

In one embodiment, the method further comprises purging a process chamber between etching the preliminary channel regions and annealing the etched preliminary channel regions.

In one embodiment, the method further comprises forming a gate dielectric layer on the FET channel regions.

In one embodiment, the method further comprises forming a gate surrounding the FET channel regions. The gate can include polysilicon. Also, the gate can include metal.

According to another aspect, the invention is directed to a method of fabricating a field effect transistor (FET). According to the method, source and drain regions are formed on a semiconductor substrate. A plurality of preliminary channel regions are formed coupled between the source and drain regions. Forming the plurality of preliminary channel regions comprises: (i) forming a channel layer and a sacrificial layer vertically adjacent to the channel layer, and (ii) trimming the channel layer to a desired dimension such that a front surface of at least one of the preliminary channel regions is offset with respect to a front surface of the source and drain regions in a direction normal to the front surface of the source and drain regions. The preliminary channel regions are etched, and the etched preliminary channel regions are annealed to form FET channel regions, the FET channel regions having a substantially circular cross-sectional shape.

In one embodiment, the preliminary channel regions have a substantially rectangular cross-sectional shape. In one embodiment, the preliminary channel regions have corners in cross-section.

In one embodiment, the method further comprises, after forming the preliminary channel regions, cleaning the structure to remove oxide from the structure.

In one embodiment, the channel layer and the sacrificial layer are formed epitaxially.

The channel layer can be a silicon layer, and the sacrificial layer can be a SiGe layer.

In one embodiment, the trimming comprises etching the channel layer. Etching the channel layer can include a chemical dry etch.

In one embodiment, forming the plurality of preliminary channel regions comprises forming a plurality of sacrificial layers vertically adjacent to the channel layer. The sacrificial layers can include SiGe. An upper sacrificial layer can have a lower concentration of germanium than a lower sacrificial layer.

In one embodiment, the method further comprises purging a process chamber between etching the preliminary channel regions and annealing the etched preliminary channel regions.

In one embodiment, the method further comprises forming a gate dielectric layer on the FET channel regions.

In one embodiment, the method further comprises forming a gate surrounding the FET channel regions. In one embodiment, the gate comprises polysilicon. In one embodiment, the gate comprises metal.

According to another aspect, the invention is directed to a method of fabricating a field effect transistor (FET). According to the method, source and drain regions are formed on a semiconductor substrate. A preliminary channel region is formed coupled between the source and drain regions, forming the preliminary channel region comprising: (i) forming a channel layer and a sacrificial layer vertically adjacent to the channel layer, and (ii) trimming the channel layer to a desired dimension such that a front surface of the preliminary channel region is offset with respect to a front surface of the source and drain regions in a direction normal to the front surface of the source and drain regions. A remaining portion of the sacrificial layer is removed. The trimmed channel layer is etched, and the etched channel layer is annealed to form a FET channel region, the FET channel region having a substantially circular cross-sectional shape.

According to another aspect, the invention is directed to a method of fabricating a field effect transistor (FET). According to the method, source and drain regions are formed on a semiconductor substrate. A preliminary channel region is formed coupled between the source and drain regions, forming the preliminary channel region comprising forming a channel layer and a sacrificial layer vertically adjacent to the channel layer. A remaining portion of the sacrificial layer is removed. The preliminary channel region is etched, and the etched preliminary channel region is annealed to form a FET channel region, the FET channel region having a substantially circular cross-sectional shape.

According to another aspect, the invention is directed to a method of fabricating a field effect transistor (FET). According to the method, source and drain regions are fainted on a semiconductor substrate. A plurality of preliminary channel regions are formed coupled between the source and drain regions. The preliminary channel regions are etched, and the etched preliminary channel regions are annealed to form FET channel regions, the FET channel regions having a substantially circular cross-sectional shape.

According to another aspect, the invention is directed to a field effect transistor (FET) having a semiconductor substrate and source and drain regions on the semiconductor substrate. A plurality of FET channel regions are coupled between the source and drain regions, the FET channel regions having a substantially circular cross-sectional shape, the FET channel regions being trimmed to a desired dimension such that a front surface of at least one of the FET channel regions is offset with respect to a front surface of the source and drain regions in a direction normal to the front surface of the source and drain regions.

In one embodiment, the FET further comprises a gate dielectric layer on the FET channel regions.

In one embodiment, the FET further comprises a gate surrounding the FET channel regions.

In one embodiment, the FET further comprises the gate comprises polysilicon. In one embodiment, the FET further comprises the gate comprises metal.

According to another aspect, the invention is directed to a field effect transistor (FET) comprising a semiconductor substrate and source and drain regions on the semiconductor substrate. A FET channel region is coupled between the source and drain regions, the FET channel region having a substantially circular cross-sectional shape, the FET channel region being trimmed to a desired dimension such that a front surface of the FET channel region is offset with respect to a front surface of the source and drain regions in a direction normal to the front surface of the source and drain regions.

According to the invention, a round-shaped (circular) nano-wire channel is produced in a FET using an etching process and an annealing process using $H_2$. This process of manufacturing the FET reduces an electric field concentration phenomenon that occurs at the corner of a conventional FET having a square-shaped nano-wire channel. In producing the round-shaped nano-wire channel, the H2 annealing is done at relatively low temperature. Annealing at high temperature results in a nano-wire whose shape can result in the FET channel being cut or interrupted due to a silicon migration effect. Also, an uppermost silicon germanium layer used as a sacrificial layer can have a higher percentage of germanium than the other layers. This results in preventing the uppermost silicon channel layer from being consumed during etching. A damascene process can be used to form a self-aligned transistor gate.

BRIEF DESCRIPTION OF THE DRAWINGS

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIG. 7 is a schematic cross-sectional view of another embodiment of the FET of FIG. 1, corresponding to line A-A' of FIG. 1.

DETAILED DESCRIPTION OF PREFERRED EMBODIMENTS

In the following detailed description, when a layer is described as being formed on another layer or on a substrate, the layer may be formed on the other layer or on the substrate, or a third layer may be interposed between the layer and the other layer or the substrate.

Figure 1:
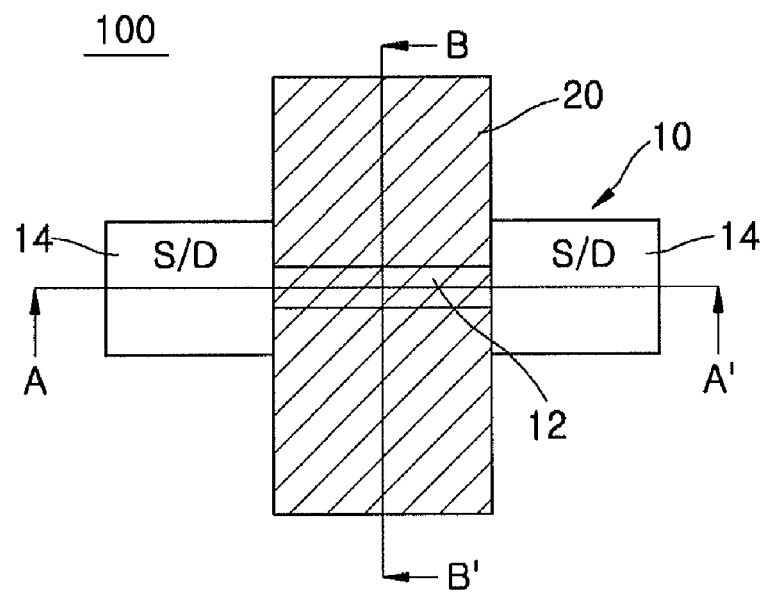
FIG. 1 is a schematic top plan view of a FET with a round or circular shaped nano-wire channel in accordance with an embodiment of the invention.
Figure 2A:
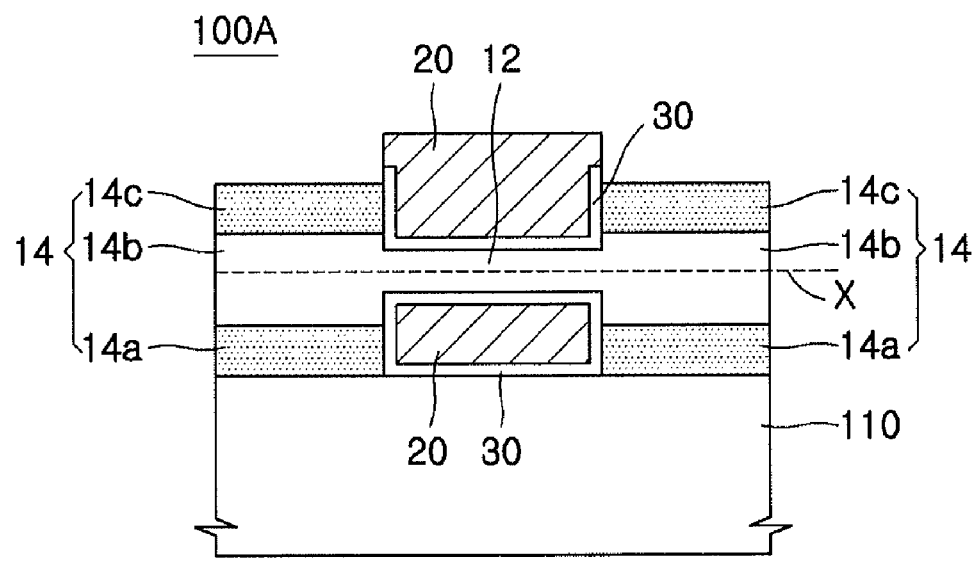
FIG. 2A is a schematic cross-sectional view of one embodiment of the FET of FIG. 1, taken along line A-A' of FIG. 1.
Figure 2B:
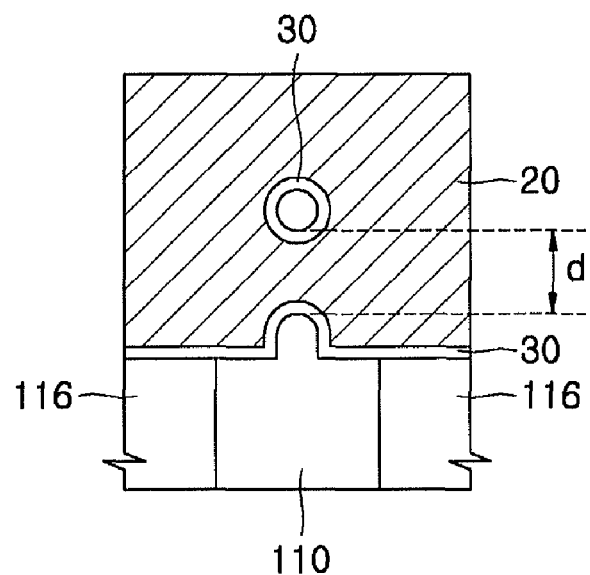
FIG. 2B is a schematic cross-sectional view of the embodiment of the FET of FIG. 2A taken along line B-B' of FIG. 1.

FIG. 1 is a schematic top plan view of a FET with a round or circular shaped nano-wire channel in accordance with an embodiment of the invention. FIG. 2A is a schematic cross-sectional view of one embodiment of the FET of FIG. 1, taken along line A-A' of FIG. 1. FIG. 2B is a schematic cross-sectional view of the embodiment of the FET of FIG. 2A taken along line B-B' of FIG. 1.

Referring to FIGS. 1, 2A and 2B, the FET structure of the invention includes a semiconductor substrate 110. Source/drain regions 14 are formed on the substrate 110. the source/drain regions 14 include a stacked structure of a first silicon germanium (SiGe) layer 14*a*, a silicon layer 14*b* and a second SiGe layer 14*c* sequentially stacked as shown. The first and second SiGe layers and the silicon layers can be epitaxial layers. The silicon layer 14b includes a round-shaped nano-wire channel region 12 extending across the structure along a longitudinal line X between the source/drain regions 14. A portion of the substrate 110 protrudes above the surface of the substrate in the region beneath the nano-wire channel region 12. As noted in FIG. 2B, the nano-wire channel 12 and the protruding portion of the substrate 110 are separated by a distance d. An isolation region 116 isolates the FET from other devices. A gate dielectric layer 30 made of a material such as silicon oxide surrounds the nano-wire channel region 12. The gate dielectric layer 30 also surrounds the protruding portion of the substrate. A gate 20 made of a conductive material such as polysilicon, metal or a combination of polysilicon and metal surrounds the nano-wire channel region 12. The gate 20 is insulated from the nano-wire channel 12 by the gate dielectric layer 30.

Figure 3:
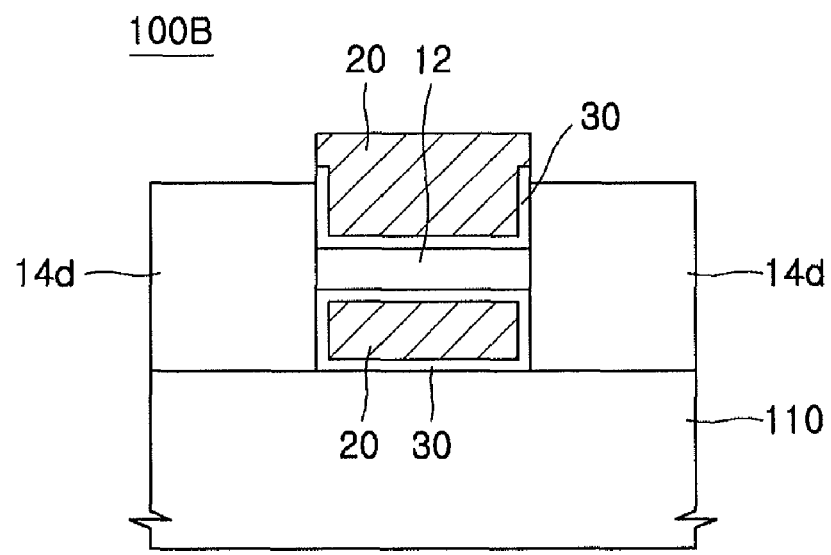
FIG. 3 is a schematic cross-sectional view of another embodiment of the FET of FIG. 1, corresponding to line A-A' of FIG. 1.

FIG. 3 is a schematic cross-sectional view of another embodiment of the FET of FIG. 1, corresponding to line A-A' of FIG. 1. The device 100B of FIG. 3 differs from that of FIGS. 2A and 2B in that, instead of the multiple-layer stack having the first and second SiGe layers 14a and 14c and the Si layer 14b, the device of FIG. 3 has only a single Si layer 14d, which serves as the source/drain regions of the device and provides the round-shaped nano-wire channel 12 of the device.

Figure 4A:
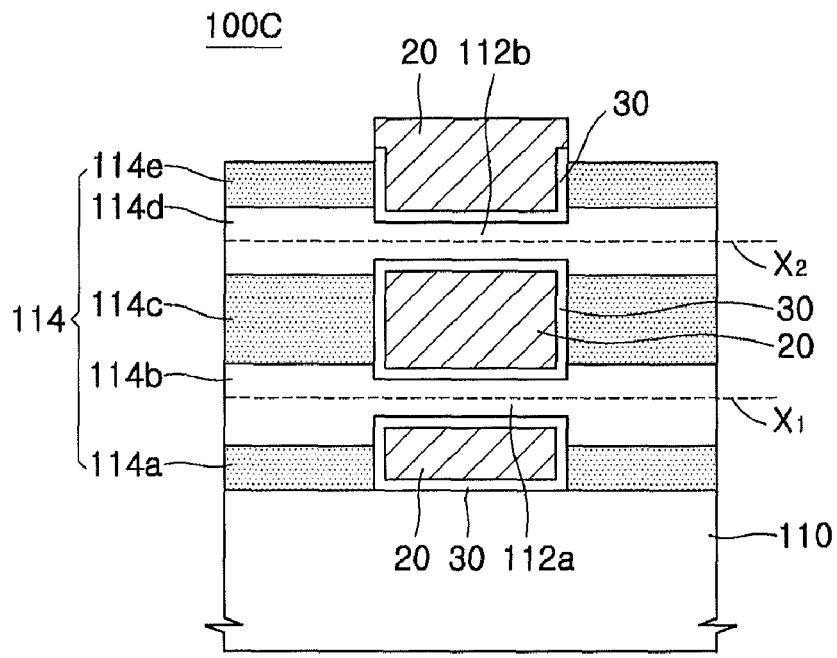
FIG. 4A is a schematic cross-sectional view of another embodiment of the FET in accordance with the invention corresponding to the line A-A' of FIG. 1.
Figure 4B:
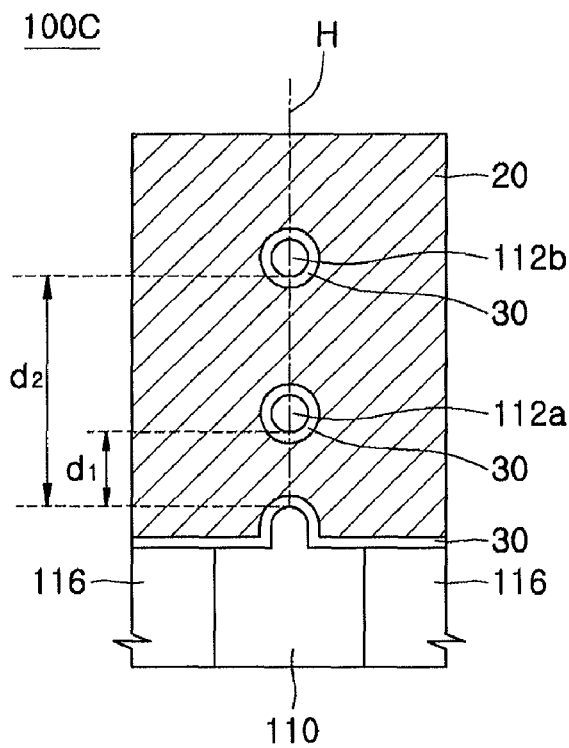
FIG. 4B is a schematic cross-sectional view of the embodiment of the FET of FIG. 4A corresponding to the line B-B' of FIG. 1.

FIG. 4A is a schematic cross-sectional view of another embodiment of the FET in accordance with the invention corresponding to the line A-A' of FIG. 1. FIG. 4B is a schematic cross-sectional view of the embodiment of the FET of FIG. 4A corresponding to the line B-B' of FIG. 1.

Referring to FIGS. 4A and 4B, the structure is different from that of the forgoing embodiments in that the FET 100C includes multiple, i.e., two, round-shaped nano-wire channels 112a and 112b, instead of a single nano-wire channel 12. The structure 100C includes a semiconductor substrate 110. Source/drain regions 114 are formed on the substrate 110. The source/drain regions 114 are formed of a stacked structure of a first SiGe layer 114a, a first Si layer 114b, a second SiGe layer 114c, a second Si layer 114d and a third SiGe layer 114e sequentially stacked as shown. The first, second and third SiGe layers 114a, 114c and 114e and the first and second Si layers 114b and 114d can be epitaxial layers. The first Si layer 114b includes a first round-shaped nano-wire channel region 112a extending along a longitudinal line $X_1$ across the structure between the source/drain regions 114. The second Si layer 114d includes a second round-shaped nano-wire channel 112b extending along a longitudinal line $X_2$ across the structure between the source/drain regions 114. A portion of the substrate 110 protrudes above the surface of the substrate in the region beneath the nano-wire channel regions 112a and 112b. As noted in FIG. 4B, the first nano-wire channel 112a and the protruding portion of the substrate 110 are separated by a distance $d_1$. Also, the second nano-wire channel region 112b and the protruding portion of the substrate 110 are separated by a distance $d_2$. An isolation region 116 isolates the FET 100C from other devices. A gate dielectric layer 30 made of a material such as silicon oxide surrounds the first and second nano-wire channel regions 112a and 112b. The gate dielectric layer 30 also surrounds the protruding portion of the substrate. A gate 20 made of a conductive material such as polysilicon, metal or a combination of polysilicon and metal surrounds the nano-wire channel regions 112a and 112b. The gate 20 is insulated from the nano-wire channels 112a and 112b by the gate dielectric layer 30.

Figure 5:
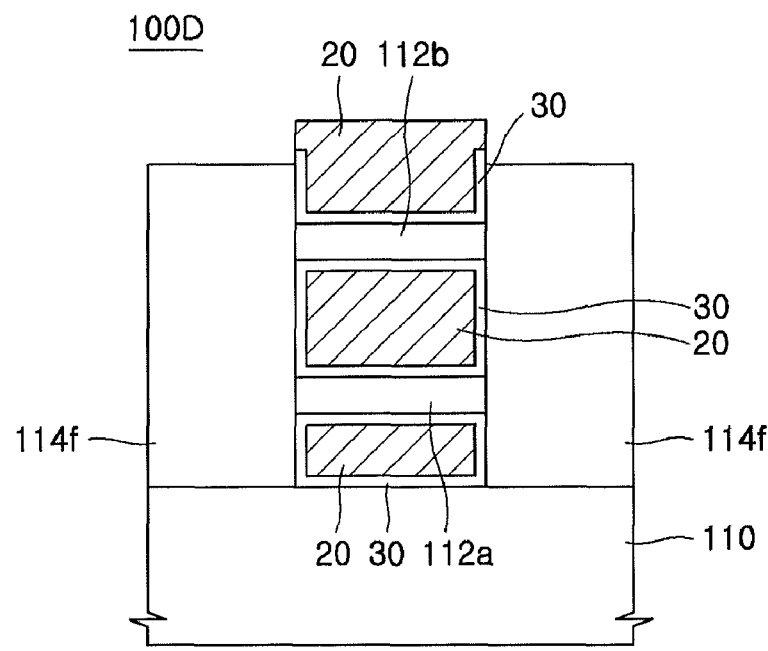
FIG. 5 is a schematic cross-sectional view of another embodiment of the FET of FIG. 1, corresponding to line A-A' of FIG. 1.

FIG. 5 is a schematic cross-sectional view of another embodiment of the FET of FIG. 1, corresponding to line A-A' of FIG. 1. The device 100D of FIG. 5 differs from that of FIGS. 4a and 4b in that, instead of the multiple-layer stack having the first, second and third SiGe layers 114a, 114c and 114e and the first and second Si layers 114b and 114d, the device of FIG. 5 has only a single Si layer 114f, which serves as the source/drain regions of the device and provides the round-shaped nano-wire channels 112a and 112b of the device.

Figure 6A:
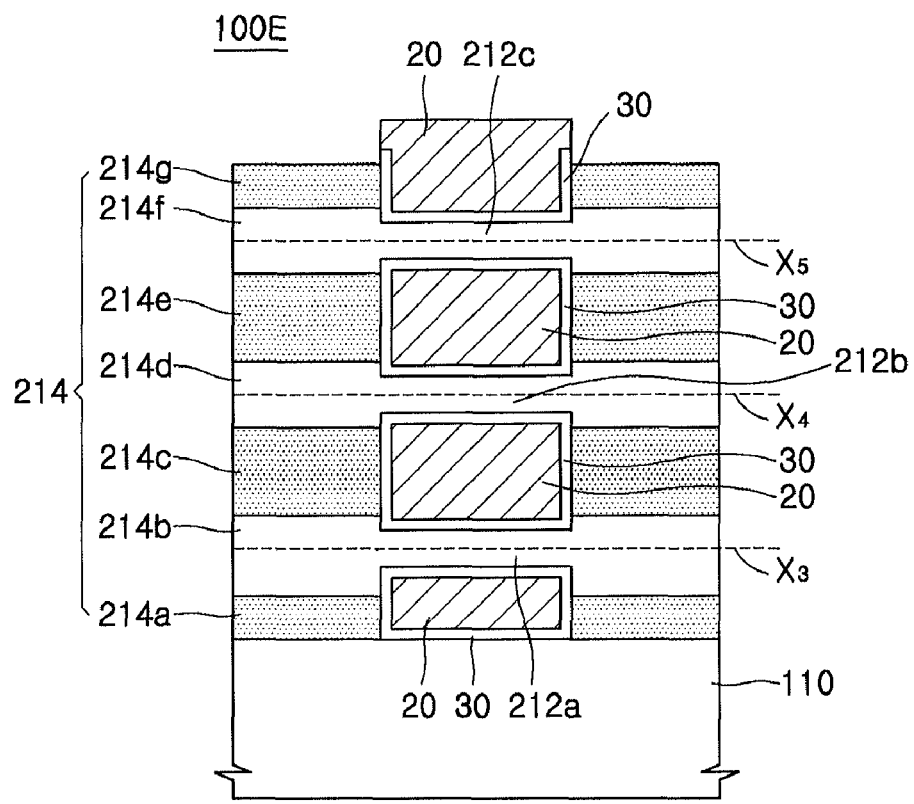
FIG. 6A is a schematic cross-sectional view of another embodiment of a FET in accordance with the invention corresponding to the line A-A' of FIG. 1.
Figure 6B:
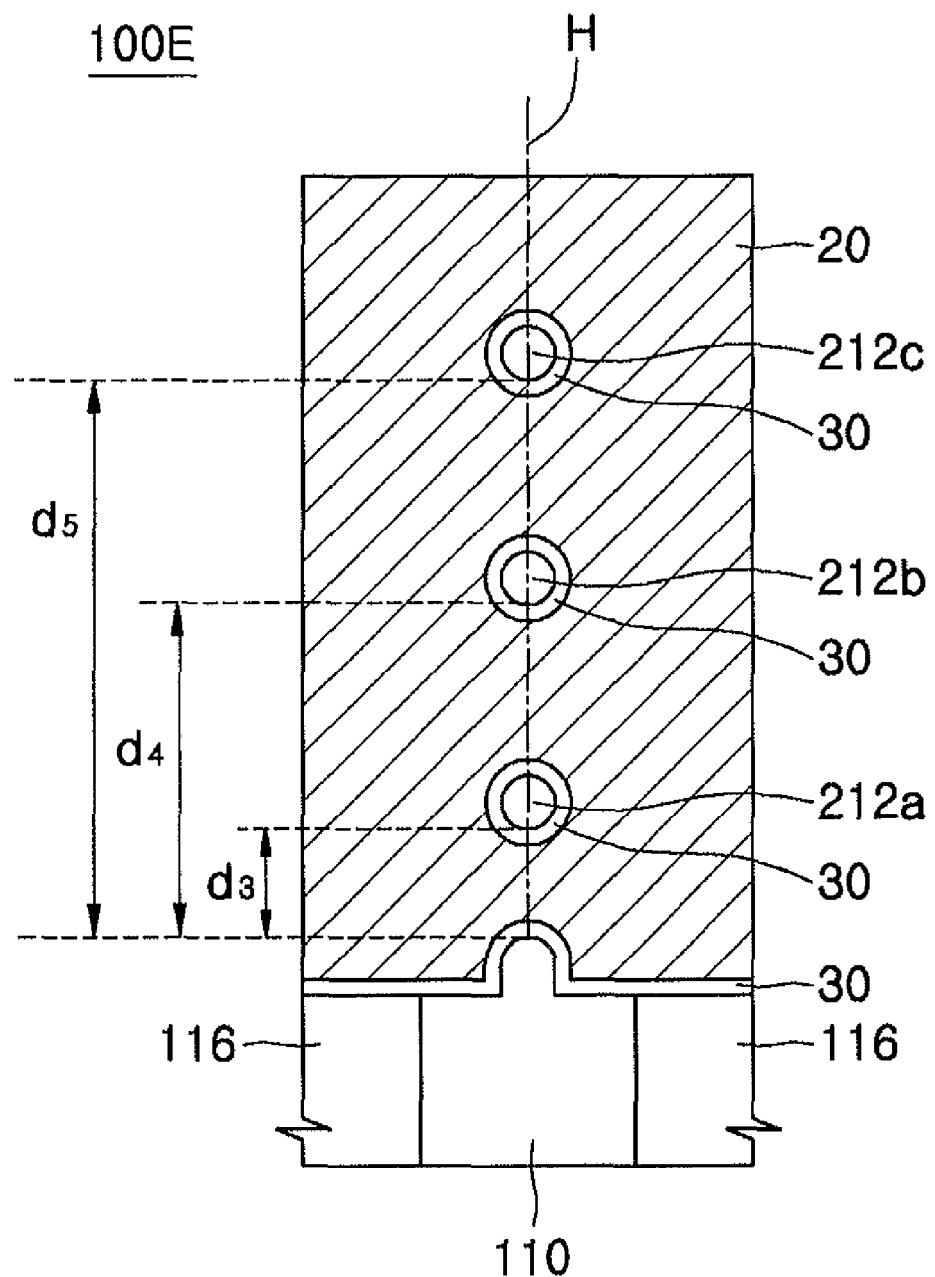
FIG. 6B is a schematic cross-sectional view of the FET of FIG. 6A corresponding to the line B-B' of FIG. 1.

FIG. 6A is a schematic cross-sectional view of another embodiment of a FET in accordance with the invention corresponding to the line A-A' of FIG. 1. FIG. 6B is a schematic cross-sectional view of the FET of FIG. 6A corresponding to the line B-B' of FIG. 1.

Referring to FIGS. 6A and 6B, the structure is different from that of the forgoing embodiments in that the FET 100E includes multiple, i.e., three, round-shaped nano-wire channels 212a, 212b and 212c, instead of the single nano-wire channel 12 or the two nano-wire channels 112a and 112b. The structure 100E includes a semiconductor substrate 110. Source/drain regions 214 are formed on the substrate 110. The source/drain regions 214 are formed of a stacked structure of a first SiGe layer 214a, a first Si layer 214b, a second SiGe layer 214c, a second Si layer 214d, a third SiGe layer 214e, a third Si layer 214f and a fourth SiGe layer 214g sequentially stacked as shown. The first, second, third and fourth SiGe layers 214a, 214c, 214e and 214g and the first, second and third Si layers 214b, 214d and 214f can be epitaxial layers. The first Si layer 214b includes a first round-shaped nano-wire channel region 212a extending along a longitudinal line $X_3$ across the structure between the source/drain regions 214. The second Si layer 214d includes a second round-shaped nano-wire channel 212b extending along a longitudinal line $X_4$ across the structure between the source/drain regions 214. The third Si layer 214f includes a third round-shaped nano-wire channel 212c extending along a longitudinal line $X_5$ across the structure between the source/drain regions 214. A portion of the substrate 110 protrudes above the surface of the substrate in the region beneath the nano-wire channel regions 212a, 212b and 212c. As noted in FIG. 6B, the first nano-wire channel 212a and the protruding portion of the substrate 110 are separated by a distance $d_1$. Also, the second nano-wire channel region 212b and the protruding portion of the substrate 110 are separated by a distance $d_2$. Also, the third nano-wire channel 212c and the protruding portion of the substrate 110 are separated by a distance $d_3$. An isolation region 116 isolates the FET 100E from other devices. A gate dielectric layer 30 made of a material such as silicon oxide surrounds the first, second and third nano-wire channel regions 212a, 212b and 212c. The gate dielectric layer 30 also surrounds the protruding portion of the substrate. A gate 20 made of a conductive material such as polysilicon, metal or a combination of polysilicon and metal surrounds the nano-wire channel regions 212a, 212b and 212c. The gate 20 is insulated from the nano-wire channels 212a, 212b and 212c by the gate dielectric layer 30.

FIG. 7 is a schematic cross-sectional view of another embodiment of the FET of FIG. 1, corresponding to line A-A' of FIG. 1. The device 100F of FIG. 7 differs from that of FIGS. 6A and 6B in that, instead of the multiple-layer stack having the first, second, third and fourth SiGe layers 214a, 214c, 214e and 214g and the first, second and third Si layers 214b, 214d and 214f, the device of FIG. 7 has only a single Si layer 214h, which serves as the source/drain regions of the device and provides the round-shaped nano-wire channels 212a, 212b and 212c of the device.

Figure 8:
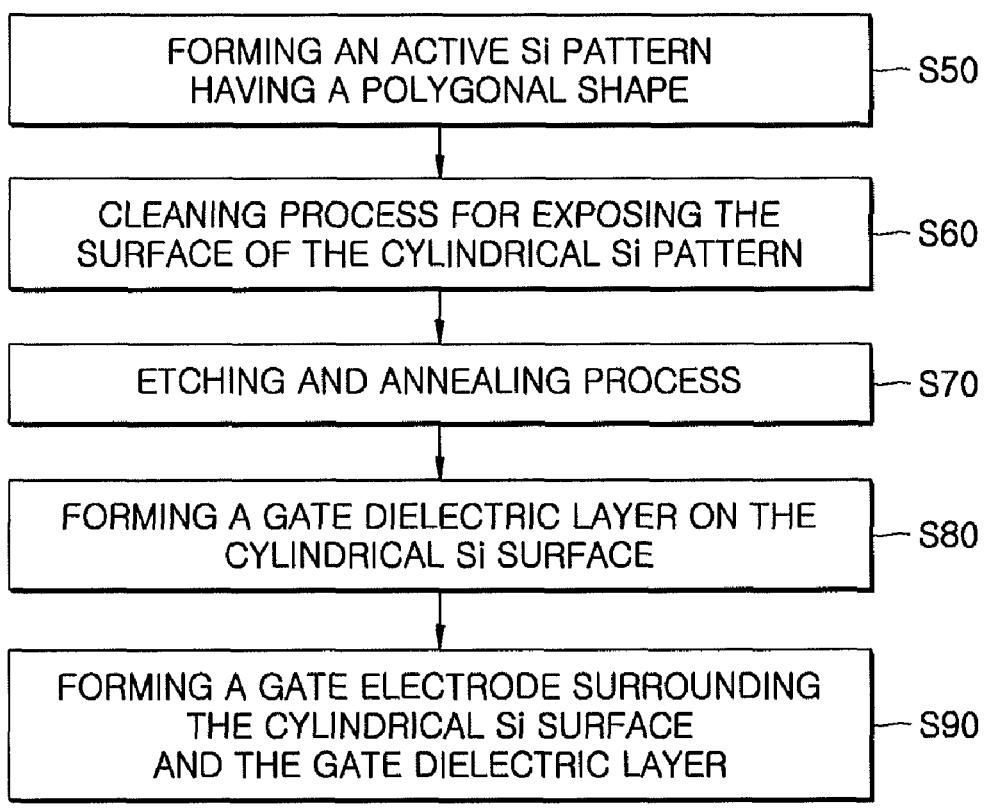
FIG. 8 is a logical flow diagram illustrating the process of forming the round-shaped nano-wire channels and gate of the FET according to the invention.

FIG. 8 is a logical flow diagram illustrating the process of forming the round-shaped nano-wire channels and gate of the FET according to the invention. FIGS. 9A through 9D are schematic perspective views illustrating the steps in the process of forming the nano-wire channels and gate of the invention. The process of forming the nano-wire channels, the gate and the FET of the invention described herein is applicable to any of the embodiments of the FET described herein. Specifically, the formation process is applicable to a FET having any number of round-shaped nano-wire channels.

Referring to FIGS. 8 and 9A through 9D, in step S50, an active Si pattern having a polygonal cross-sectional shape is formed. For example, referring specifically to FIG. 9A, the active Si pattern 402 can have flat exterior surfaces 402b and a substantially square shape 402a in cross section.

Next, in step S60, a cleaning process is performed to remove any oxide that may have formed on the active Si pattern 402.

Figure 9A:
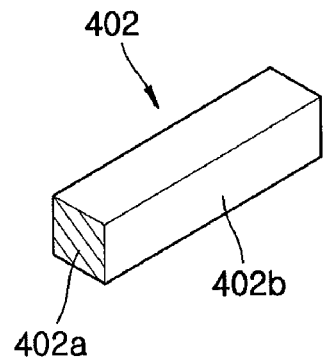
FIGS. 9A through 9D are schematic perspective views illustrating the steps in the process of forming the nano-wire channels and gate of the invention.
Figure 9B:
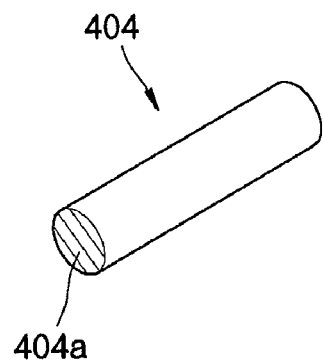

Next, in step S70, etching is performed to remove square corners from the active pattern 402. An annealing step is performed to complete the round-shaped Si nano-wire channel 404. As shown in FIG. 9B, the channel 404 has a substantially round shape 404a in cross section.

Figure 9C:
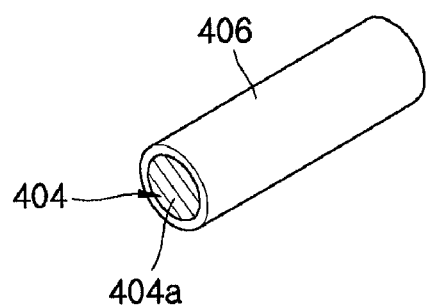

Next, in step S80, a gate dielectric layer 406 is formed surrounding the round-shaped nano-wire channel region 404, as shown in FIG. 9C.

Figure 9D:
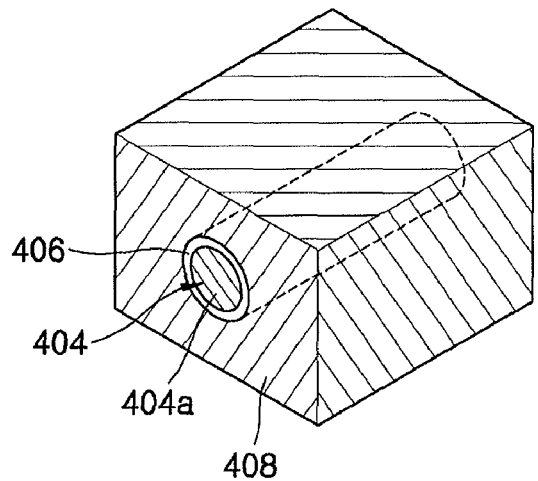

Next, in step S90, a gate electrode 408 is formed surrounding the gate dielectric layer 406 and the round-shaped or cylindrical Si nano-wire channel 404, as shown in FIG. 9D. The gate electrode 408 is made of a conductive material such as polysilicon, metal, or a combination of polysilicon and metal.

Figure 10:
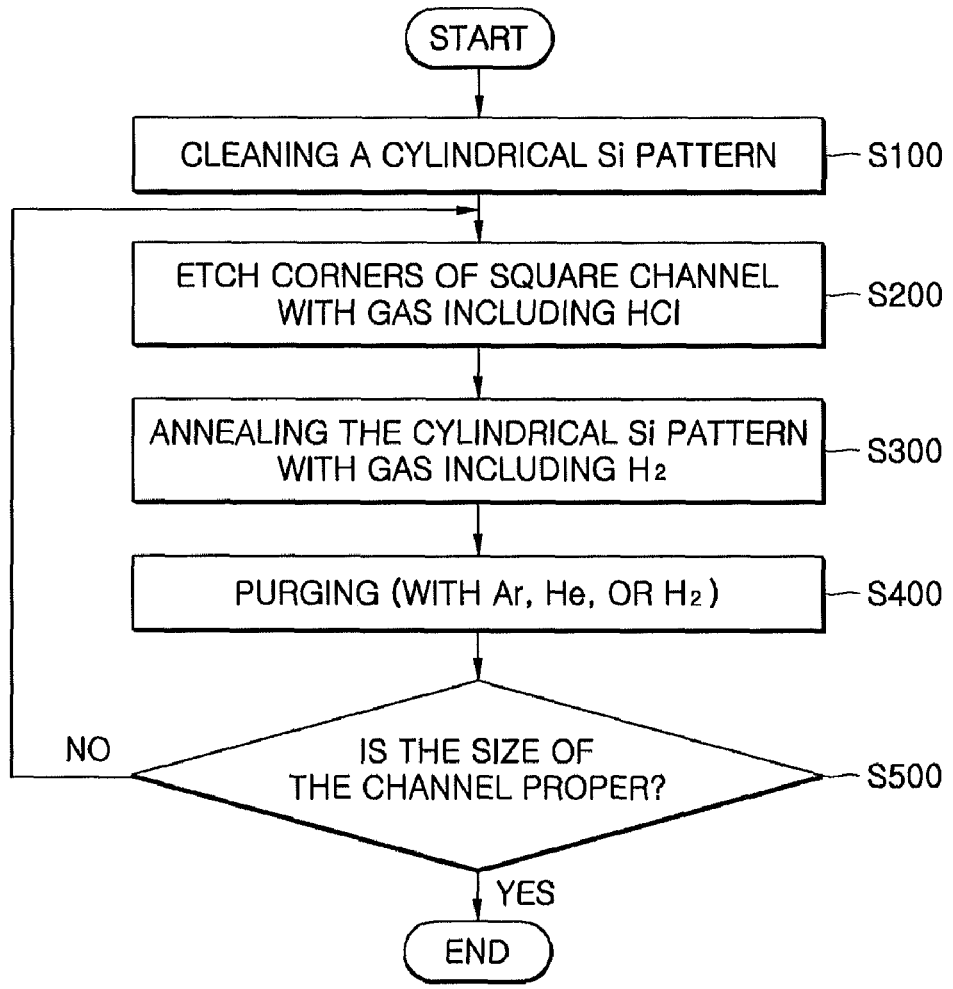
FIG. 10 is a detailed flow diagram illustrating the process of forming a round nano-wire channel from a square nano-wire channel, according to an embodiment of the invention.

FIG. 10 is a detailed flow diagram illustrating the process of forming the round nano-wire channel 404 from the square nano-wire channel 402. FIG. 10 will be described below in detail.

Figure 11A:
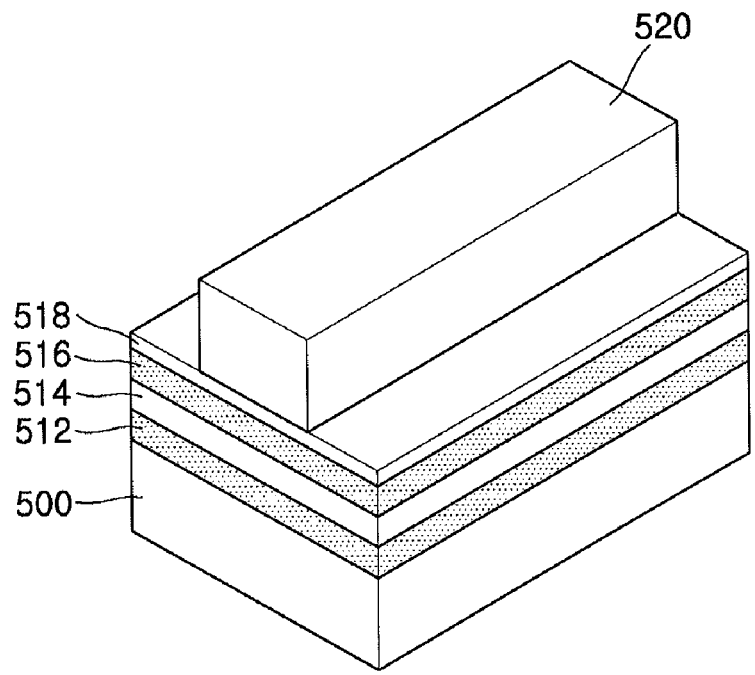
FIGS. 11A through 11M are schematic perspective views illustrating steps in a process of manufacturing the FET of the invention, in accordance with an embodiment of the invention.

FIGS. 11A through 11M are schematic perspective views illustrating steps in a process of manufacturing the FET of the invention, in accordance with an embodiment of the invention. Referring to FIG. 11A, a silicon substrate 500 is provided. A first silicon germanium (SiGe) layer 512 is formed on top of the substrate 500. The first SiGe layer 512 can have a thickness of 5-50 nm and can contain 15-20% germanium. An active silicon layer 514 is formed over the first SiGe layer. The silicon layer 514 is the layer of which the round-shaped nano-wire channel region of the FET will eventually be formed. A second SiGe layer 516 is formed on the silicon layer 514. The second SiGe layer 516 can be formed to a thickness of 5-50 nm and can contain 5-10% germanium. The second SiGe layer 516 may have a lower concentration of germanium such that during a subsequent etching process, the rate at which the upper layer of SiGe is consumed is lower to prevent damage to the silicon layer 514 to ensure a good nano-wire channel. In one embodiment, the first and second SiGe layers 512 and 516 and the silicon layer 514 are grown epitaxially to the thickness of 5-50 nm.

A capping layer 518 is then formed over the second SiGe layer 516. The capping layer may be a buffer oxide layer made of a material having a high etch selectivity with respect to silicon nitride (SiN), such as silicon oxide, for a subsequent etching process. Next, a hard mask layer, made of a material such as SiN, is formed on the buffer oxide layer 518. The hard mask layer is patterned such as by photolithographic and etching processes to form a hard mask pattern 520 on the buffer oxide layer 518.

Figure 11B:
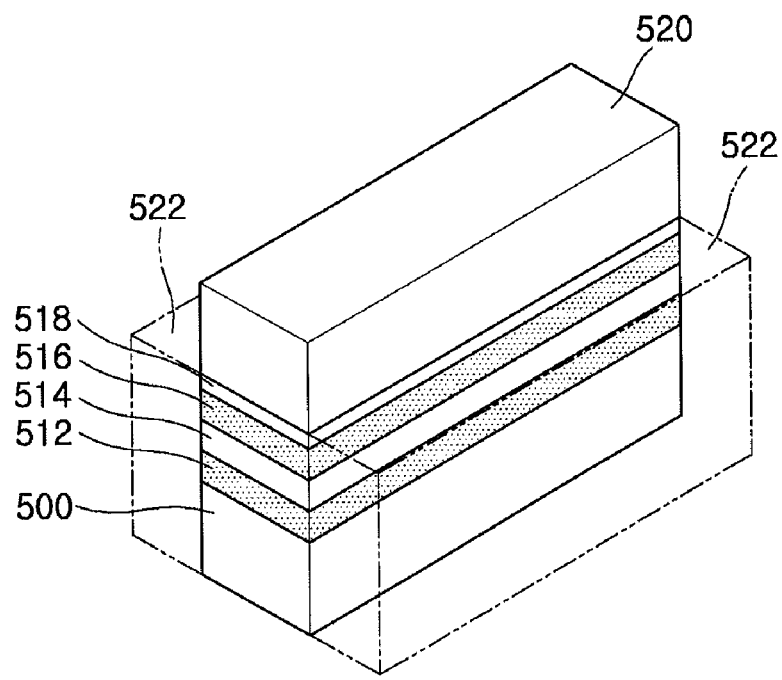

Referring to FIG. 11B, the structure is etched using the hard mask pattern 520 as an etching mask to form a STI trench 522. In one embodiment, the trench depth is 150-350 nm.

Figure 11C:
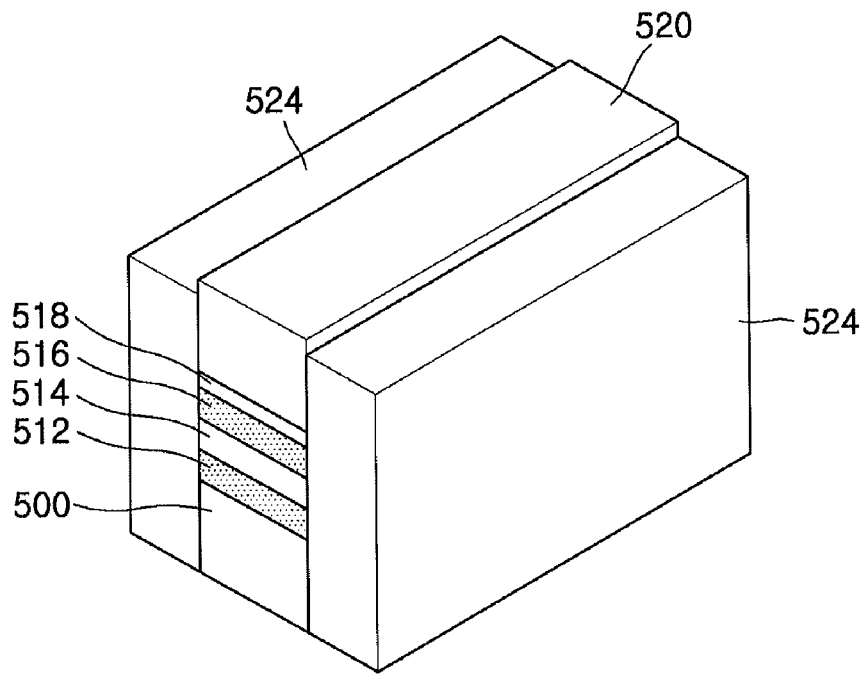

Referring to FIG. 11C, next, a shallow trench isolation (STI) 524 is formed in the trench 522. The STI is formed by a high density plasma (HDP) process to deposit an oxide. After the HDP process, a chemical mechanical polishing (CMP) process is carried out to expose the top surface of the hard mask pattern 520. As shown in the drawing, the slurry used during the CMP process has a higher polishing rate on the HDP oxide 524 than it has on the hard mask pattern 520 such that a step is created between the HDP oxide 524 and the hard mask pattern 520.

Figure 11D:
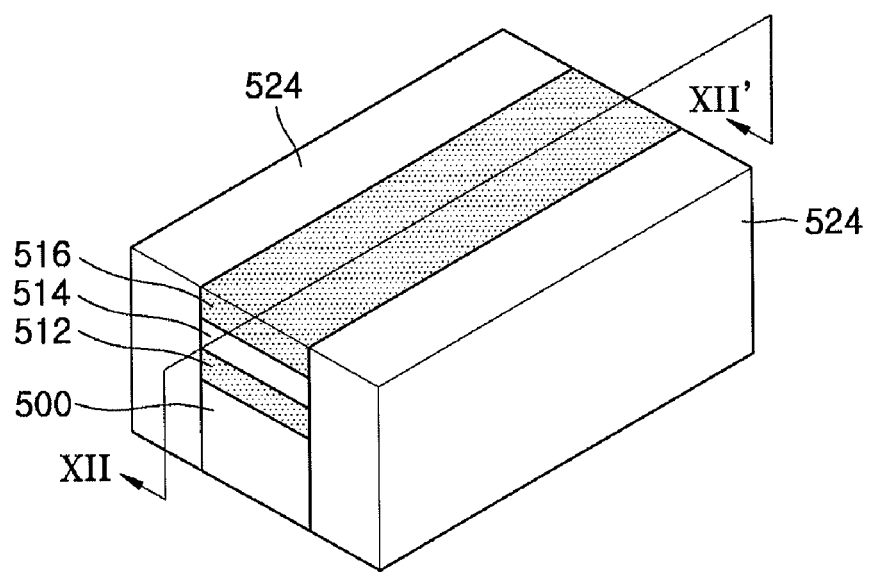

Next, referring to FIG. 11D, the hard mask pattern 520 and a portion of the HDP oxide is removed using phosphoric acid, leaving the buffer oxide layer 518 and the top surface of the HDP oxide 524 exposed on the top of the structure.

Figure 11E:
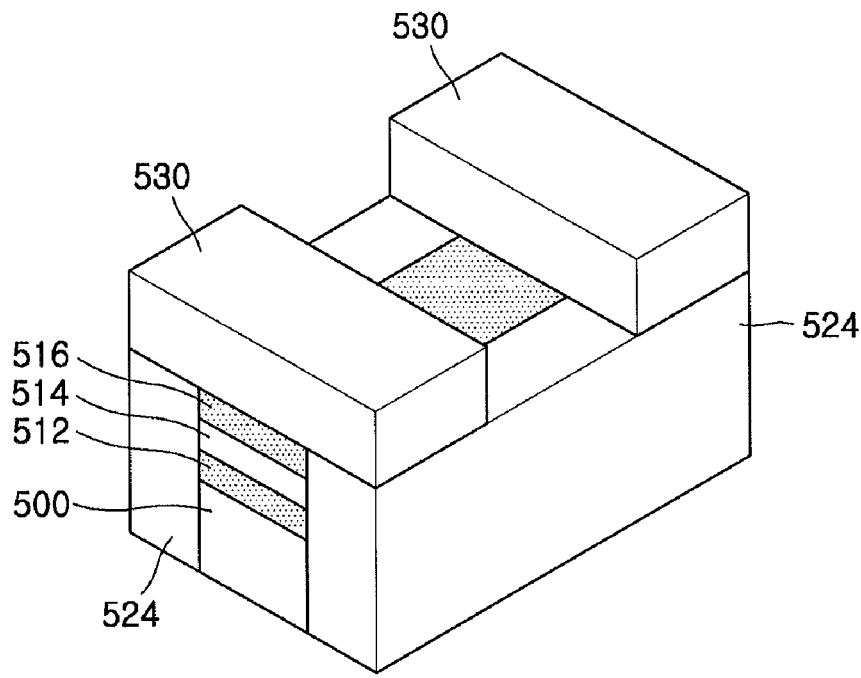

Next, referring to FIG. 11E, a second hard mask pattern 530 is formed on the top surface of the structure by forming a hard mask layer made of SiN and then applying photolithographic and etching processes to pattern the hard mask layer.

Figure 11F:
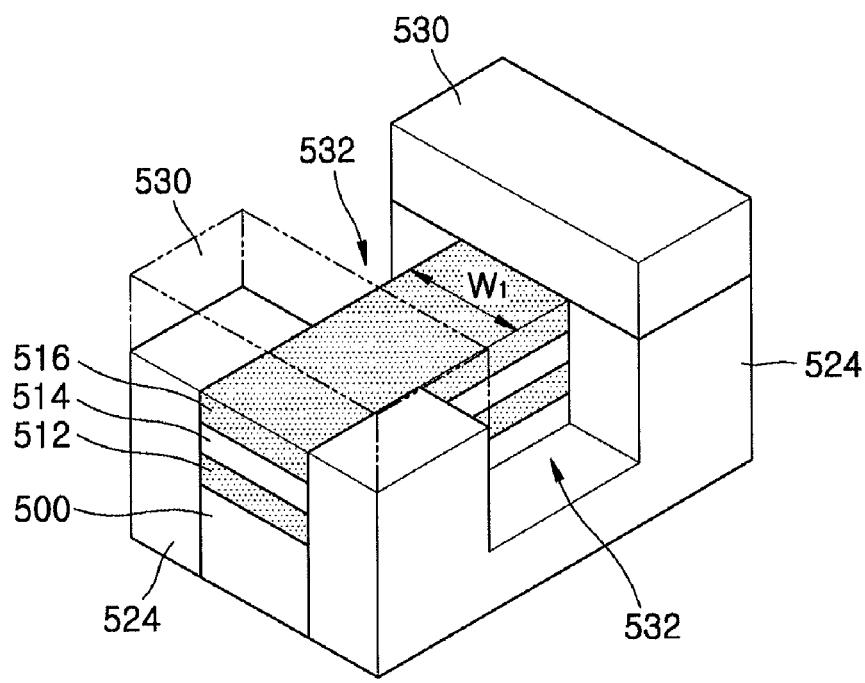

Next, referring to FIG. 11F, the structure is etched using the second hard mask pattern 530 as an etching mask to form a STI recess 532. The depth of the recess 532 is controlled to be deeper than the total thickness of the first and second SiGe layers 512, 516 and the Si layer 514. That is, the recess 532 extends down into the structure deeper than the bottom of the epitaxial SiGe and Si layers. The width of the remaining epitaxial SiGe and Si layers, as well as a portion of the substrate beneath the epitaxial layers is indicated in the figure as $W_1$.

Figure 11G:
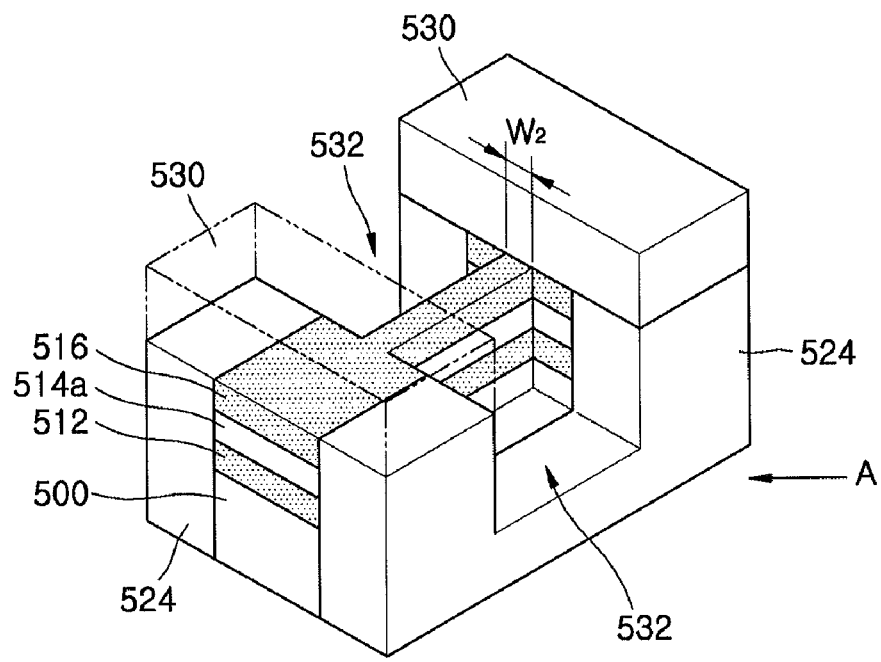
Figure 11H:
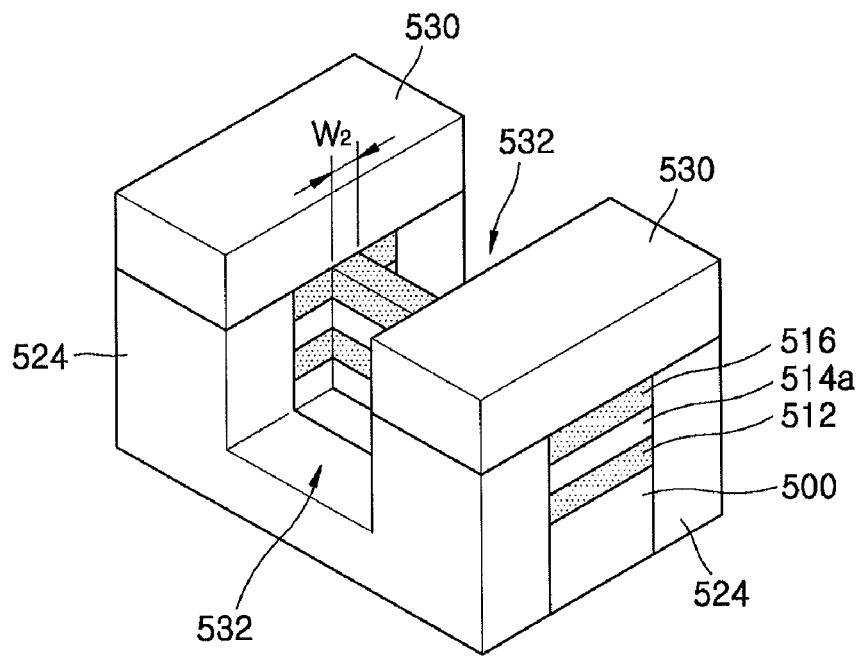

Next, referring to FIG. 11G, the remaining portion of the SiGe epitaxial layers 512 and 516, the remaining portion of the active Si layer 514a and the raised portion of the substrate beneath the epitaxial layers having the width $W_1$ are optionally trimmed by etching, such that the remaining portion of the epitaxial layers and the raised portion of the substrate beneath the epitaxial layers has a width $W_2$. The etching is preferably a chemical dry etch (CDE), which can be carried out, for example, at 400 W, 225 mTorr, 250 degrees C. for 20 seconds, in an atmosphere containing $CF_4$ and $O_2$ at flow rates of 60 and 150 sccm, respectively. The width $W_2$ is selected based on a desired size of the final nano-wire channel to be formed. The CDE is performed to reduce the channel width to $W_2$ and to make the channel square in cross-section. FIG. 11H is the structure of FIG. 11G rotated 90 degrees to clearly illustrate the resulting structure.

Figure 11I:
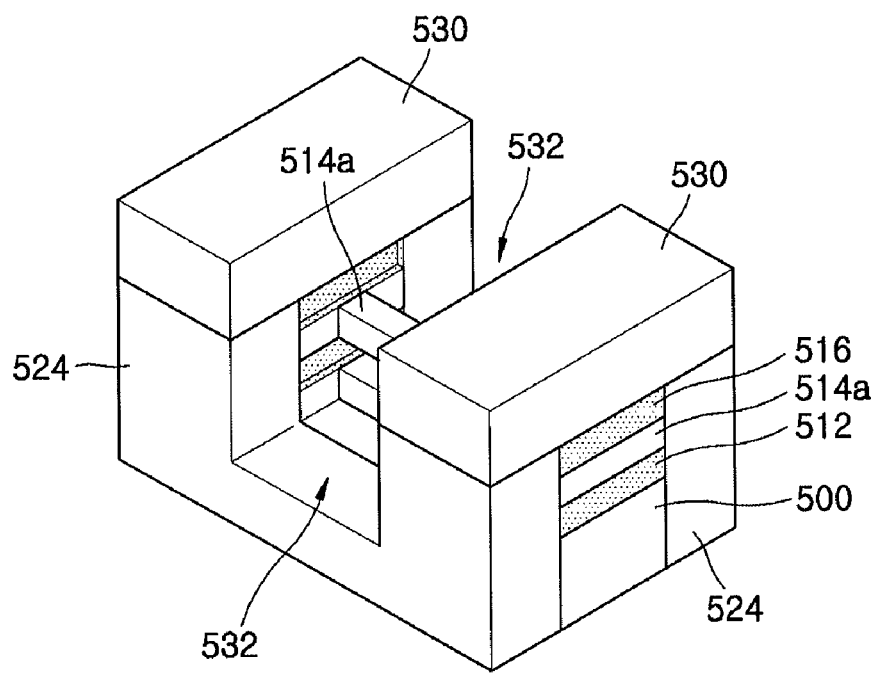

Next, referring to FIG. 11I, the sacrificial SiGe layers 512 and 516 on the top and bottom of the channel region 514a are removed to completely expose the channel region 514a. It is also noted that a rectangular portion of the substrate 500 also remains beneath the channel region 514a following this step. This step is performed by a chemical wet etch using a chemical including $CH_3COOOH$ (or $CH_3COOH$)+HF+DIW (deionized water) (+H2O2+surfactant, etc.).

Figure 11J:
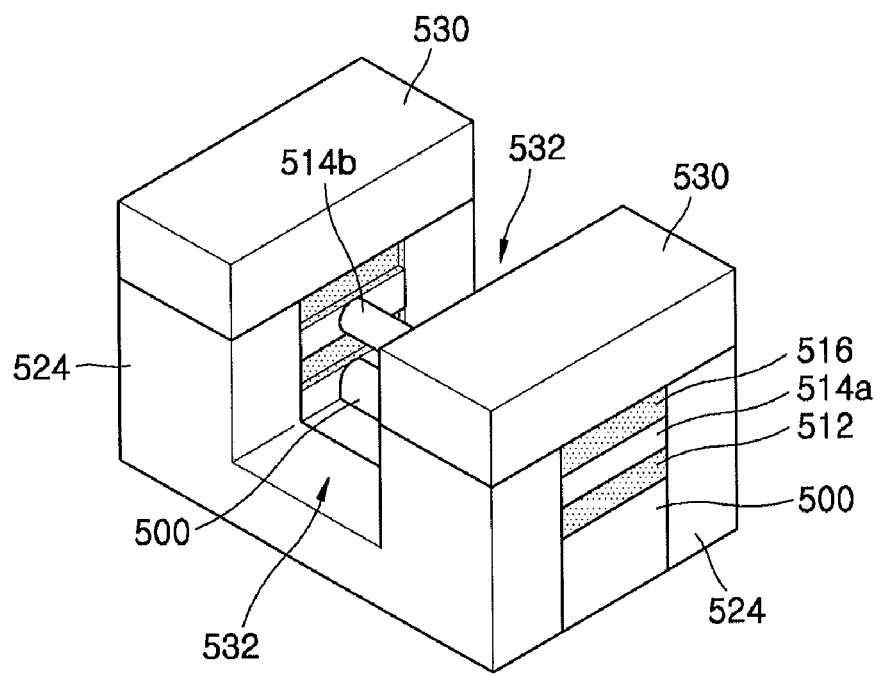

Next, referring to FIG. 11J, the square cross-sectional channel region 514a is formed into a nano-wire channel 514b having a round or circular cross-section. This is performed by etching and annealing the square cross-sectional channel region 514a until it becomes the round nano-wire channel 514b.

FIG. 12 is a flow diagram illustrating the process of forming the round nano-wire channel 514b from the square nano-wire channel 514a. First, an optional cleaning step S100 is performed in an atmosphere of H2. In one embodiment, the cleaning is performed in an atmosphere of 100% H2. Alternatively, the atmosphere can also contain Ar and/or He with or without the H2. In one embodiment, the cleaning is performed at a pressure of 0.1 to 10 Torr and a temperature of 600-900 degrees C. In one particular embodiment, the cleaning is performed at a temperature of 700-800 degrees C. The gas flow rate during the cleaning step can be 1-500 sccm, and the process time can be 1-5 minutes.

After the cleaning step, the four corners of the square nano-wire channel 514a are etched in step S200. The etching is carried out by introducing a combination of HCl and H2 gas into the process chamber. In one particular embodiment, the gas flow rate of HCl during the etching is 100-2000 sccm, and the gas flow rate of the H2 is 100-2000 sccm. The flow rate ratio of HCl:H2 can be in a range of 5:5 to 3:7. In one particular embodiment, the flow rate ratio of HCl:H2 is 300 sccm: 500 sccm. The etch temperature can be in the range of 600-900 degrees C., and the pressure can be 10-100 Torr. The time of the etch can be in the range of 1-120 seconds.

The etch of step S200 can be performed under one of at least three possible sets of conditions. For a relatively long-duration, low-temperature etch, the etch temperature can be in the range of 600-700 degrees C. For a relatively short-duration, high-temperature etch, the etch temperature can be in the range of 850-900 degrees C. Between the two process conditions above, the middle-duration, middle-temperature etch can be carried out at a temperature between 750 and 820 degrees C.

After the etching process, a low-temperature annealing is carried out in step S300 to form the round-shaped nano-wire channel region 514b. The annealing is performed in an atmosphere of H2 gas. In one embodiment, the annealing is performed at a pressure of 0.1-10 Torr. If the pressure is lowered, the process time can also be lowered. In one embodiment, the annealing is performed at a temperature of 600-900 degrees C. for a period of 10-800 seconds. In one embodiment, the $H_2$ gas flow rate is 1-500 sccm. In one particular embodiment, the annealing is carried out at a temperature of about 810 degrees C., at a pressure of 5 Torr and for a period of 500 seconds.

The etching and annealing steps can be repeated as many times as are needed to form the final round-shaped nano-wire channel 514b. Between the annealing step S300 and the next repeated etching step S200, a purging step S400 can be performed to remove the remaining annealing $H_2$ gas from the process chamber. The purge can be performed using at least one of Ar, He and $H_2$ gas.

After the purging step S400, a determination is made in step S500 as to whether the channel 514b is the desired size and/or shape. If the channel 514b is of the proper shape and size, the process ends. If not, the process returns to step S200 to begin another cycle of etching, annealing (S300) and optional purging (S400).

Figure 11K:
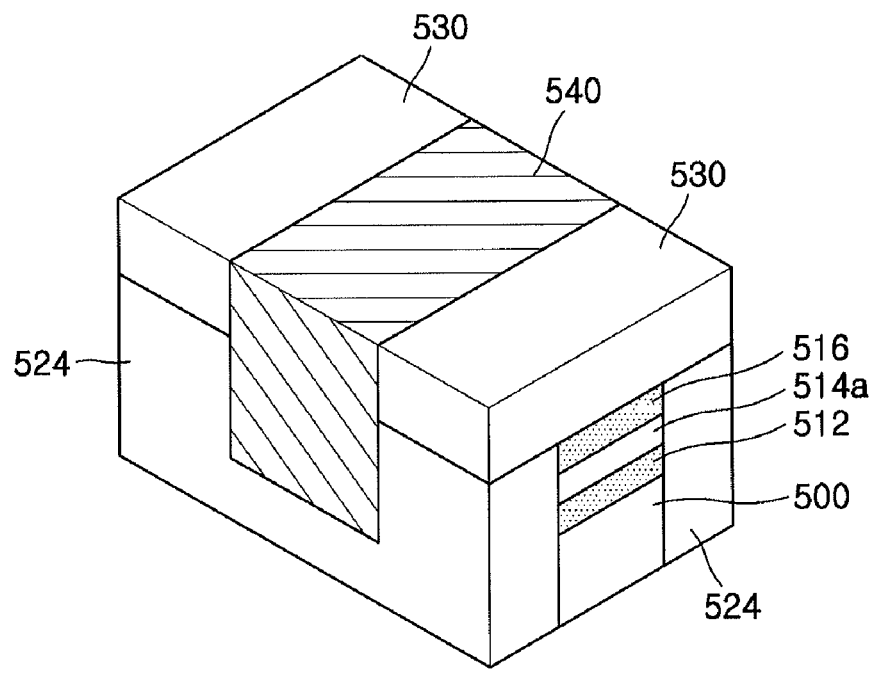

Referring to FIG. 11K, after the round-shaped nano-wire channel 514b is formed, a gate dielectric layer is formed on the structure, including surrounding the nano-wire channel 514b. The gate dielectric can be formed by growing SiO2 on the structure using O2 gas. Next, a gate material such as polysilicon or a metal layer with polysilicon is formed surrounding the nano-wire channel 514b. Then the gate material is planarized such as by chemical mechanical polishing (CMP) to form the gate 540 surrounding the nano-wire channel 514b.

Figure 11L:
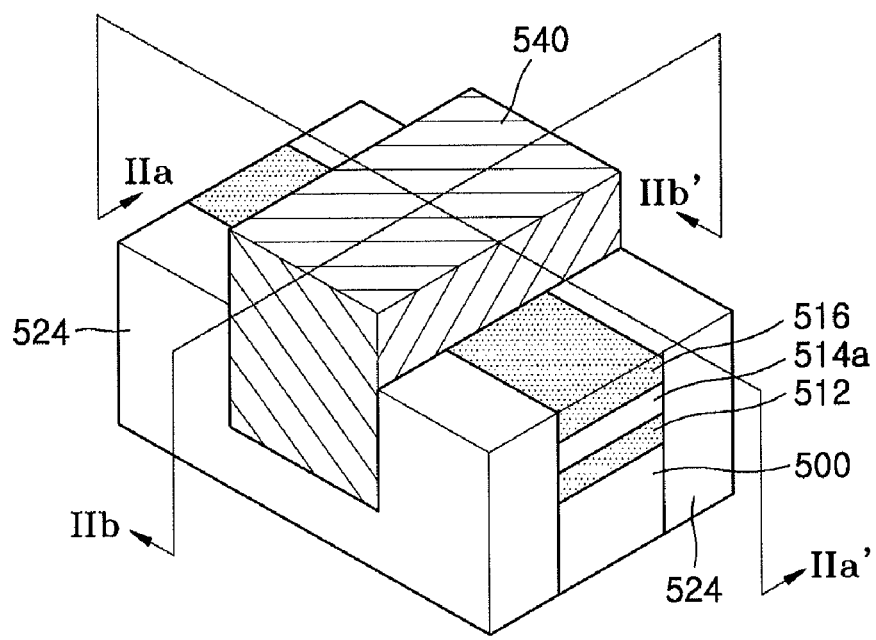
Figure 11M:
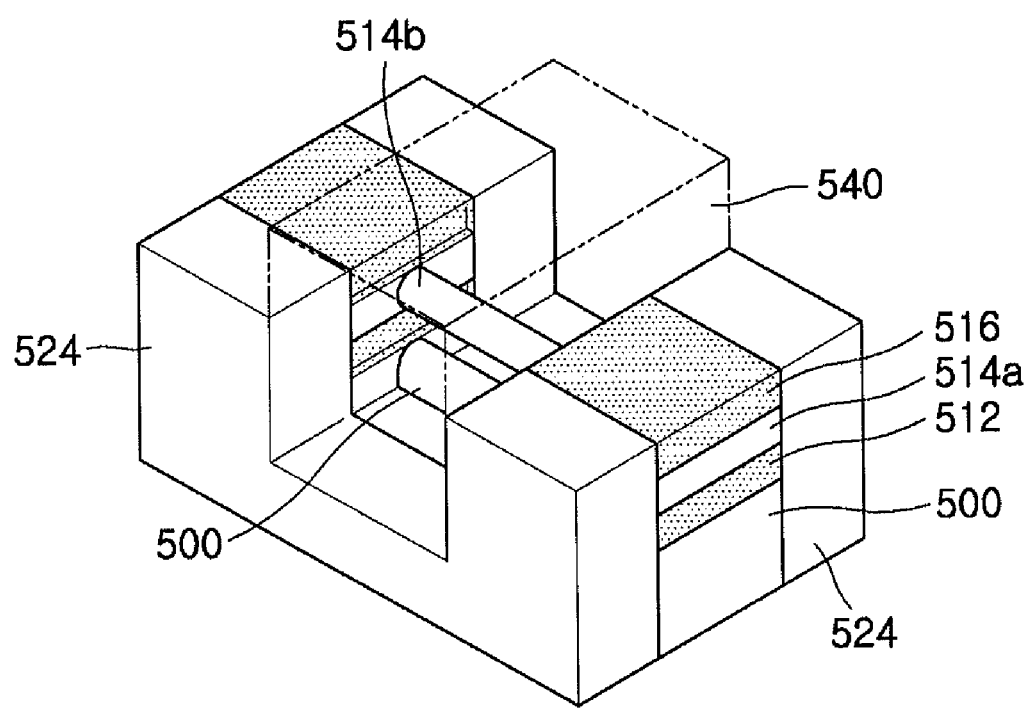

Next, referring to FIG. 11L, the second hard mask pattern 530 is removed. FIG. 11M illustrates the final structure with the gate pattern 540 shown in phantom. FIG. 11M shows the round-shaped nano-wire channel 514b and the raised portion of the substrate 500, which have both been formed into a round shape by the etching and annealing steps of the invention.

It is noted that this embodiment of manufacturing a FET is applicable to formation of any number of channel regions. Where more channel regions are to be formed, more alternating layers of SiGe and Si are initially formed.

It should be noted that FIG. 2A corresponds to a cross-sectional view of FIG. 11L, taken along line IIa-IIa' of FIG. 11L. Likewise, FIG. 2B corresponds to a cross-sectional view of FIG. 11L, taken along line IIb-IIb' of FIG. 11L.

FIGS. 12A through 12K are views illustrating steps in a process of manufacturing the FET of the invention, in accordance with another embodiment of the invention. The initial steps used in the embodiment of FIGS. 12A through 12K are the same as those illustrated in the previously described embodiment for steps 11A through 11D. For the remaining steps, where a step is analogous to a step described in connection with the embodiment of FIGS. 11A through 11M, the step is carried out in similar fashion. Therefore, description of those steps will not be repeated. FIG. 12A-12F are schematic cross-sectional views of the structure of FIG. 11D, taken along line XII-XII' of FIG. 11D, illustrating steps in the process of manufacturing a FET according to the embodiment of the invention. FIGS. 12G-12K are schematic perspective views illustrating steps in the process of manufacturing a FET according to the embodiment of the invention.

Figure 12A:
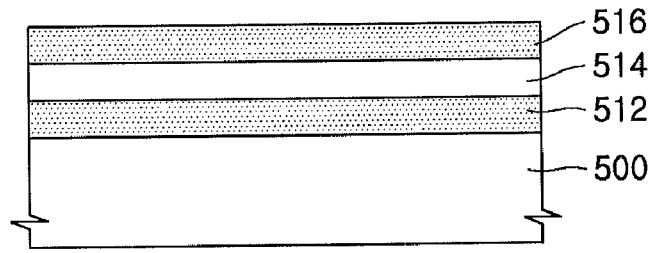
FIGS. 12A through 12K are views illustrating steps in a process of manufacturing the FET of the invention, in accordance with another embodiment of the invention.

Referring to FIG. 12A, the structure resulting after performance of steps 11A through 11D is illustrated.

Figure 12B:
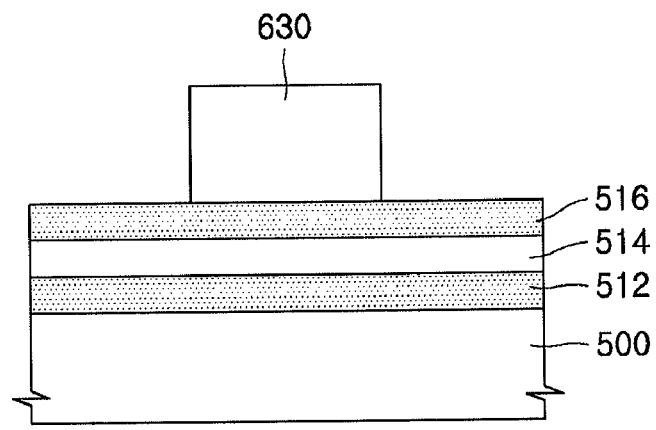

Next, referring to FIG. 12B, a hard mask pattern 630 is formed on the structure. The hard mask pattern 630 can be formed by patterning a layer of SiN.

Figure 12C:
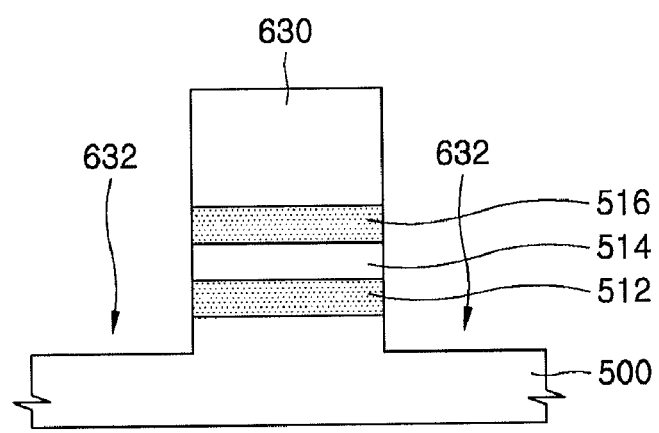

Next, referring to FIG. 12C, recessed regions 632 are formed in the structure. This can be performed by etching a trench to a depth deeper than the first epitaxial SiGe layer 512 using the hard mask pattern 630 as an etching mask.

Figure 12D:
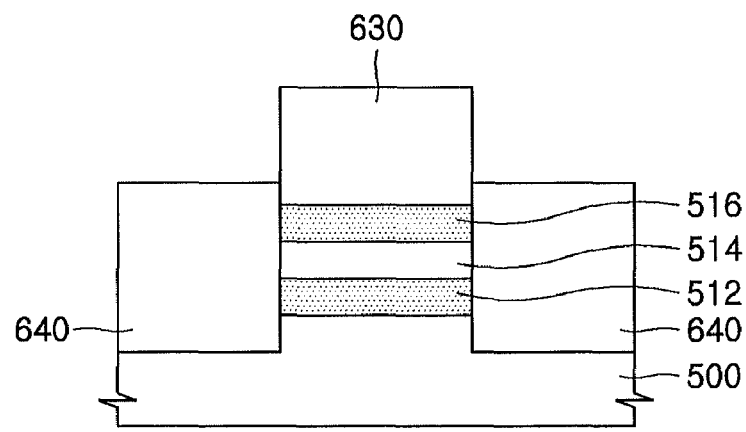

Next, referring to FIG. 12D, the recess 632 is partially filled by epitaxially growing a Si layer 640 in the recess. In one embodiment, the epitaxial Si layer 640 is grown to a depth higher than the second epitaxial SiGe layer 516.

Figure 12E:
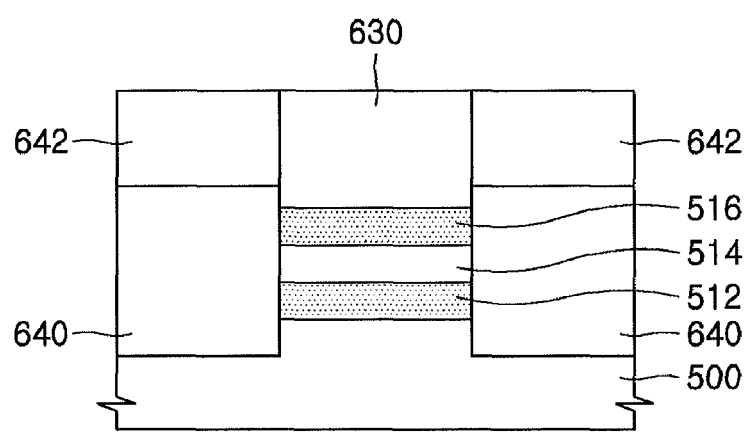

Next, referring to FIG. 12E, another hard mask pattern made of, for example, SiN is formed above the epitaxial Si layer 640 and adjacent to the hard mask pattern 630.

Figure 12F:
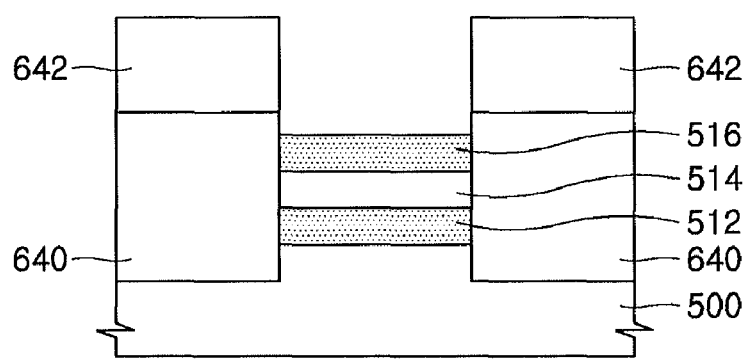
Figure 12G:
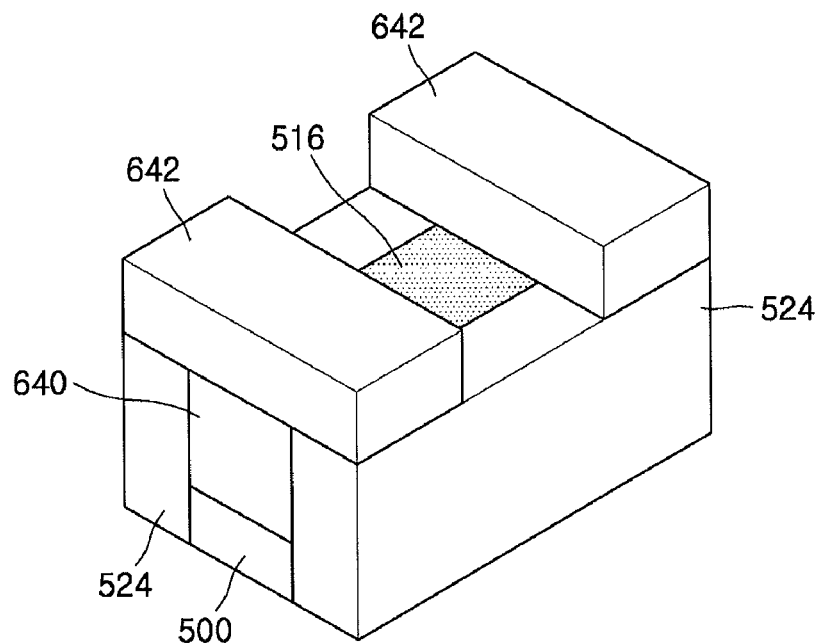

Referring to FIGS. 12F and 12G, the hard mask pattern 630 is then removed, exposing the top or second epitaxial SiGe layer 516 and a portion of the top surface of the STI dielectric layer 524.

Figure 12H:
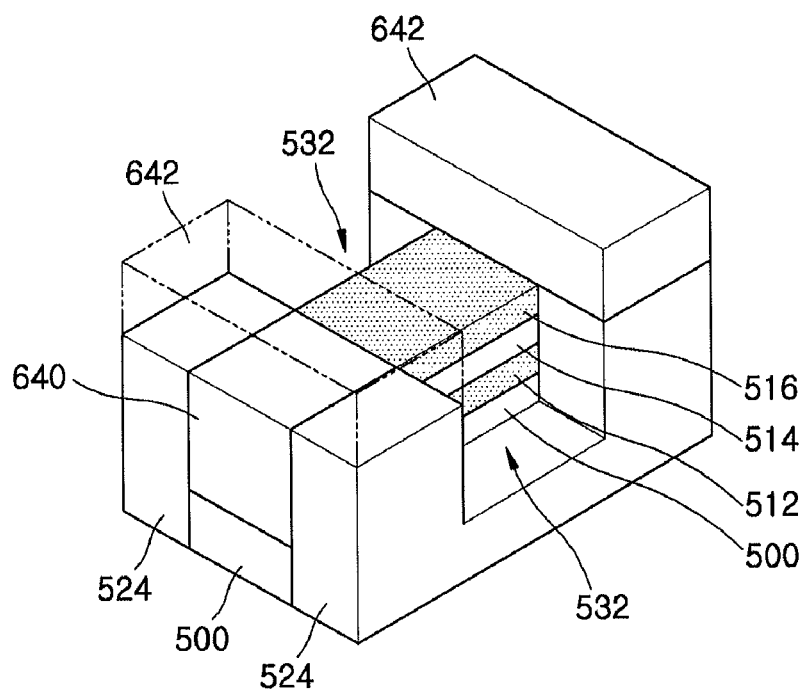

Next, referring to FIG. 12H, the structure is etched to remove a portion of the STI dielectric layer 524 to form a damascene recessed region 532 to expose the sides of the stack of the first and second SiGe layers 512 and 516, the Si layer 514 and a portion of the substrate 500 beneath the stacked epitaxial layers 512, 514 and 516.

Figure 12I:
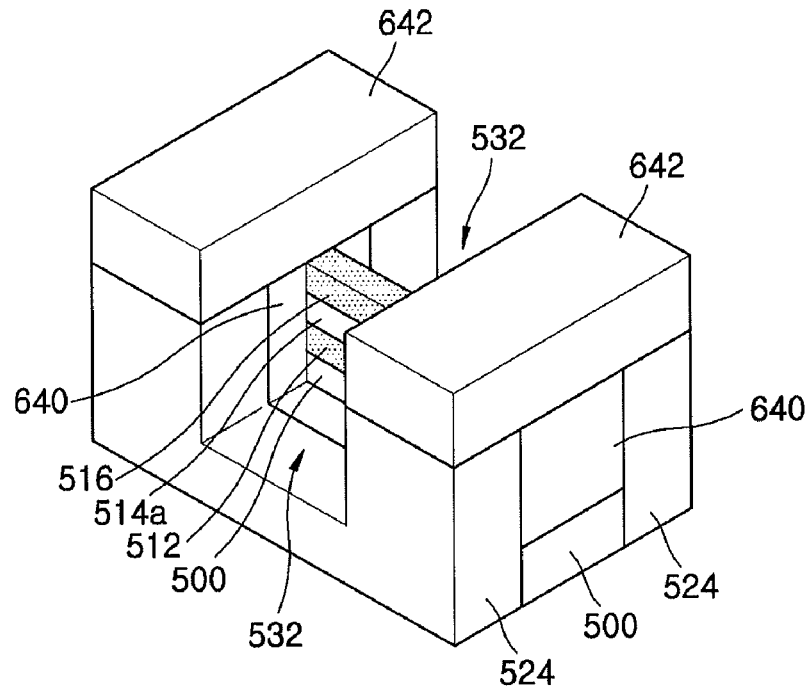

Next, referring to FIG. 12I, the structure is etched, preferably by a chemical dry etch to trim the first and second sacrificial SiGe layers 512 and 516, the Si layer 514 and the protruding portion of the substrate 500. The trimming also exposes a portion of the epitaxial Si layer 640 as shown.

Figure 12J:
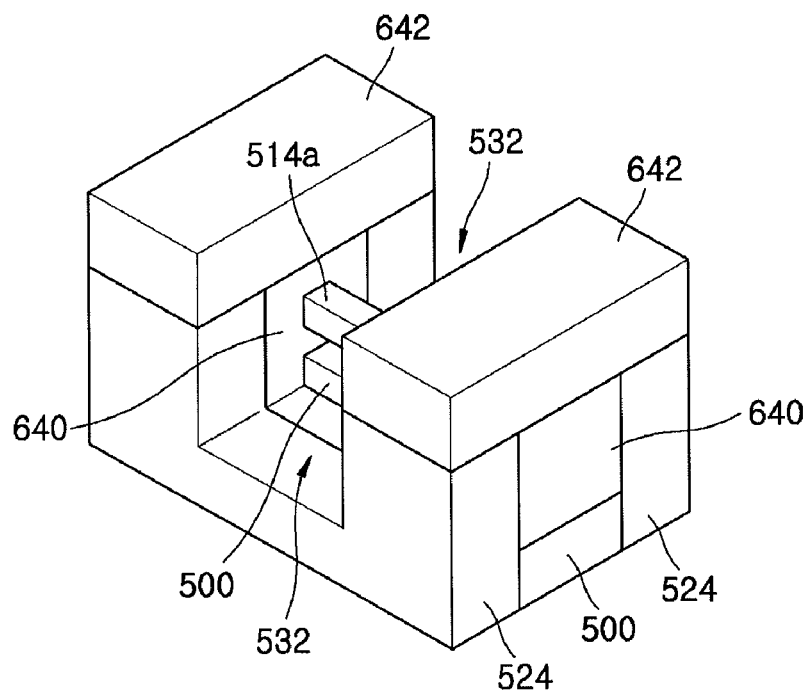

Next, referring to FIG. 12J, the sacrificial SiGe layers 512 and 516 on the top and bottom of the channel region 514a are removed to completely expose the channel region 514a. It is also noted that the rectangular protruding portion of the substrate 500 also remains beneath the channel region 514a following this step. This step is performed by a chemical wet etch using a chemical including $CH_3COOOH$ (or $CH_3COOH$)+HF+DIW (deionized water) (+$H2O2$+surfactant, etc.).

Figure 12K:
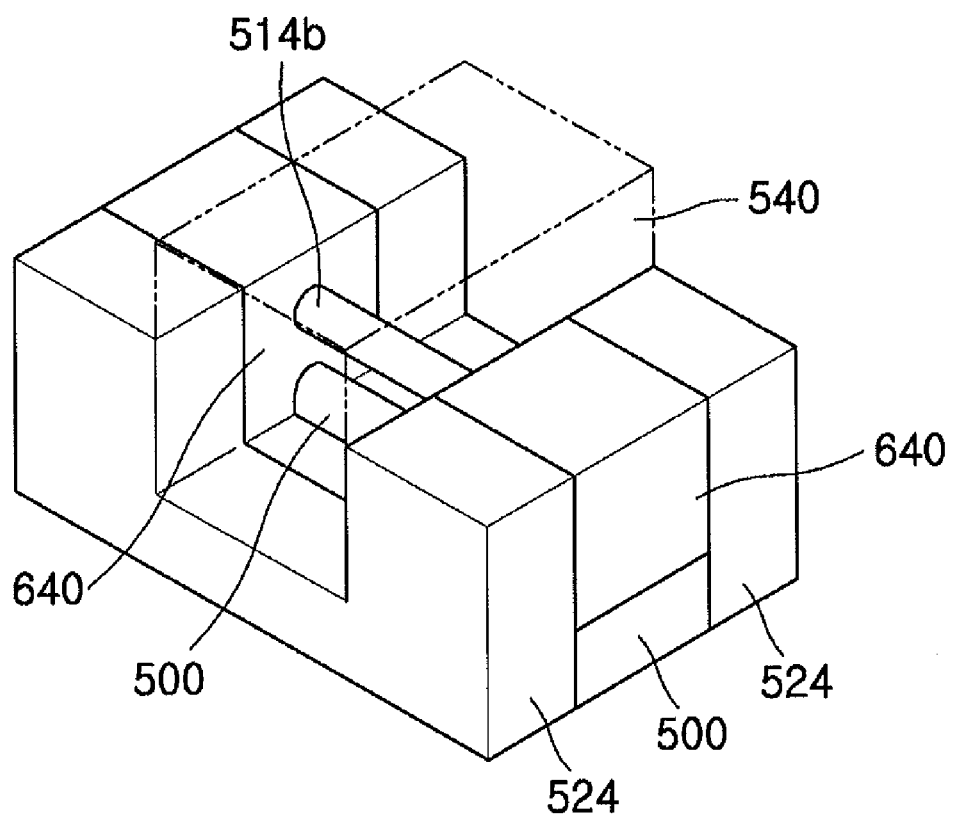

Next, referring to FIG. 12K, the channel region 514a is cleaned, etched and annealed in accordance with the description of FIG. 10 to form the round-shaped nano-wire channel region 514b. It is noted that in this embodiment, the source/drain regions of the FET are made from the single epitaxial Si layer 640, as opposed to the stacked structure of epitaxial SiGe and Si layers. It is also noted that this embodiment, like the previously described embodiment, is applicable to formation of any number of channel regions. Where more channel regions are to be formed, more alternating layers of SiGe and Si are initially formed.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A method of fabricating a field effect transistor (FET), comprising:
   forming source and drain regions on a semiconductor substrate;
   forming a plurality of preliminary channel regions coupled between the source and drain regions;
   etching the preliminary channel regions; and
   annealing the etched preliminary channel regions to form FET channel regions, the FET channel regions having a substantially circular cross-sectional shape.

2. The method of claim 1, wherein the preliminary channel regions have a substantially rectangular cross-sectional shape.

3. The method of claim 1, wherein the preliminary channel regions have corners in cross-section.

4. The method of claim 1, wherein the etching is performed in an atmosphere containing HCl.

5. The method of claim 1, wherein the etching is performed in an atmosphere containing $H_2$.

6. The method of claim 1, wherein the etching is performed in an atmosphere containing HCl and $H_2$.

7. The method of claim 6, wherein a ratio of a flow rate of HCl to a flow rate of $H_2$ is from 3:7 to 1:1.

8. The method of claim 6, wherein the ratio of flow rate of HCl to flow rate of $H_2$ is 3:5.

9. The method of claim 1, wherein the etching is performed at a temperature of 600 to 900 degrees C.

10. The method of claim 1, wherein the etching is performed for a period of 1 to 120 seconds.

11. The method of claim 1, wherein the etching is performed at a pressure of 10 to 100 Torr.

12. The method of claim 1, wherein the annealing is performed in an atmosphere containing $H_2$.

13. The method of claim 1, wherein the annealing is performed with $H_2$ introduced at a flow rate of 1 to 500 sccm.

14. The method of claim 1, wherein the annealing is performed at a temperature of 600 to 900 degrees C.

15. The method of claim 1, wherein the annealing is performed for a period of 10 to 800 seconds.

16. The method of claim 1, further comprising, after forming the preliminary channel regions, cleaning the structure to remove oxide from the structure.

17. The method of claim 16, wherein the cleaning is performed in an atmosphere containing at least one of $H_2$, Ar and He.

18. The method of claim 16, wherein the cleaning is performed at a temperature of 600 to 900 degrees C.

19. The method of claim 16, wherein the cleaning is performed at a gas flow rate of 1 to 500 sccm.

20. The method of claim 16, wherein the cleaning is performed for a period of 1 to 5 minutes.

21. The method of claim 16, wherein the cleaning is performed at a pressure of 0.1 to 10 Torr.

22. The method of claim 1, wherein forming the plurality of preliminary channel regions comprises forming a channel layer and a sacrificial layer vertically adjacent to the channel layer.

23. The method of claim 22, wherein the channel layer and the sacrificial layer are formed epitaxially.

24. The method of claim 22, wherein the channel layer is a silicon layer.

25. The method of claim 22, wherein the sacrificial layer is a SiGe layer.

26. The method of claim 22, wherein forming the plurality of preliminary channel regions further comprises trimming the channel layer to a desired dimension such that a front surface of at least one of the preliminary channel regions is offset with respect to a front surface of the source and drain regions in a direction normal to the front surface of the source and drain regions.

27. The method of claim 26, wherein the trimming comprises etching the channel layer.

28. The method of claim 27, wherein etching the channel layer comprises a chemical dry etch.

29. The method of claim 22, wherein forming the plurality of preliminary channel regions further comprises forming a mask layer over the channel layer and sacrificial layer, the mask layer defining a region separating the FET channel regions.

30. The method of claim 1, wherein forming the plurality of preliminary channel regions comprises forming a plurality of sacrificial layers vertically adjacent to a channel layer.

31. The method of claim 30, wherein the sacrificial layers comprise SiGe.

32. The method of claim 31, wherein an upper sacrificial layer has a lower concentration of germanium than a lower sacrificial layer.

33. The method of claim 1, further comprising purging a process chamber between etching the preliminary channel regions and annealing the etched preliminary channel regions.

34. The method of claim 1, wherein the etching and annealing steps are performed at least two times.

35. The method of claim 34, further comprising purging steps between a prior etching step and a next annealing step.

36. The method of claim 1, further comprising forming a gate dielectric layer on the FET channel regions.

37. The method of claim 1, further comprising forming a gate surrounding the FET channel regions.

38. The method of claim 37, wherein the gate comprises polysilicon.

39. The method of claim 37, wherein the gate comprises metal.

40. The method of claim 1, further comprising forming a protruding portion of the semiconductor substrate in a gate region beneath the FET channel region.

41. A method of fabricating a field effect transistor (FET), comprising:
   alternately stacking at least one channel layer and at least one sacrificial layer on a substrate;
   forming source and drain regions on the substrate coupled to the alternately stacked at least one channel layer and at least one sacrificial layer;
   patterning the alternately stacked at least one channel layer and at least one sacrificial layer to form a plurality of preliminary channel regions coupled between the source and drain regions;
   removing a remaining portion of the at least one sacrificial layer;
   etching the preliminary channel regions; and annealing the etched preliminary channel regions to form FET channel regions, the FET channel regions having a substantially circular cross-sectional shape.

42. The method of claim 41, wherein the preliminary channel regions have a substantially rectangular cross-sectional shape.

43. The method of claim 41, wherein the preliminary channel regions have corners in cross-section.

44. The method of claim 41, wherein the at least one channel layer and the at least one sacrificial layer are formed epitaxially.

45. The method of claim 41, wherein the at least one channel layer is a silicon layer.

46. The method of claim 41, wherein the at least one sacrificial layer is a SiGe layer.

47. The method of claim 41, wherein forming the plurality of preliminary channel regions further comprises trimming the at least one channel layer to a desired dimension such that a front surface of at least one of the preliminary channel regions is offset with respect to a front surface of the source and drain regions in a direction normal to the front surface of the source and drain regions.

48. The method of claim 47, wherein the trimming comprises etching the at least one channel layer.

49. The method of claim 48, wherein etching the at least one channel layer comprises a chemical dry etch.

50. The method of claim 41, wherein forming the plurality of preliminary channel regions further comprises forming a mask layer over the at least one channel layer and at least one sacrificial layer, the mask layer defining a region separating the FET channel regions.

51. The method of claim 41, wherein forming the plurality of preliminary channel regions comprise forming a plurality of sacrificial layers vertically adjacent to the channel layer.

52. The method of claim 51, wherein the sacrificial layers comprise SiGe.

53. The method of claim 52, wherein an upper sacrificial layer has a lower concentration of germanium than a lower sacrificial layer.

54. The method of claim 41, further comprising purging a process chamber between etching the preliminary channel regions and annealing the etched preliminary channel regions.

55. The method of claim 41, further comprising forming a gate dielectric layer on the FET channel regions.

56. The method of claim 41, further comprising forming a gate surrounding the FET channel regions.

57. The method of claim 56, wherein the gate comprises polysilicon.

58. The method of claim 56, wherein the gate comprises metal.

59. A method of fabricating a field effect transistor (FET), comprising:
forming source and drain regions on a semiconductor substrate;
forming a plurality of preliminary channel regions coupled between the source and drain regions, said forming a plurality of preliminary channel regions comprising: (i) forming a channel layer and a sacrificial layer vertically adjacent to the channel layer, and (ii) trimming the channel layer to a desired dimension such that a front surface of at least one of the preliminary channel regions is offset with respect to a front surface of the source and drain regions in a direction normal to the front surface of the source and drain regions;
etching the preliminary channel regions; and
annealing the etched preliminary channel regions to form FET channel regions, the FET channel regions having a substantially circular cross-sectional shape.

60. The method of claim 59, wherein the preliminary channel regions have a substantially rectangular cross-sectional shape.

61. The method of claim 59, wherein the preliminary channel regions have corners in cross-section.

62. The method of claim 59, further comprising, after forming the preliminary channel regions, cleaning the structure to remove oxide from the structure.

63. The method of claim 59, wherein the channel layer and the sacrificial layer are formed epitaxially.

64. The method of claim 59, wherein the channel layer is a silicon layer.

65. The method of claim 59, wherein the sacrificial layer is a SiGe layer.

66. The method of claim 59, wherein the trimming comprises etching the channel layer.

67. The method of claim 66, wherein etching the channel layer comprises a chemical dry etch.

68. The method of claim 59, wherein forming the plurality of preliminary channel regions comprises forming a plurality of sacrificial layers vertically adjacent to the channel layer.

69. The method of claim 68, wherein the sacrificial layers comprise SiGe.

70. The method of claim 69, wherein an upper sacrificial layer has a lower concentration of germanium than a lower sacrificial layer.

71. The method of claim 59, further comprising purging a process chamber between etching the preliminary channel regions and annealing the etched preliminary channel regions.

72. The method of claim 59, further comprising forming a gate dielectric layer on the FET channel regions.

73. The method of claim 59, further comprising forming a gate surrounding the FET channel regions.

74. The method of claim 73, wherein the gate comprises polysilicon.

75. The method of claim 73, wherein the gate comprises metal.

76. A method of fabricating a field effect transistor (FET), comprising:
forming source and drain regions on a semiconductor substrate;
forming a preliminary channel region coupled between the source and drain regions, said forming a preliminary channel region comprising: (i) forming a channel layer and a sacrificial layer vertically adjacent to the channel layer, and (ii) trimming the channel layer to a desired dimension such that a front surface of the preliminary channel region is offset with respect to a front surface of the source and drain regions in a direction normal to the front surface of the source and drain regions;
removing a remaining portion of the sacrificial layer;
etching the trimmed channel layer; and
annealing the etched channel layer to form a FET channel region, the FET channel region having a substantially circular cross-sectional shape.

77. A method of fabricating a field effect transistor (FET), comprising:
forming source and drain regions on a semiconductor substrate;
forming a preliminary channel region coupled between the source and drain regions, said forming a preliminary channel region comprising forming a channel layer and a sacrificial layer vertically adjacent to the channel layer;
removing a remaining portion of the sacrificial layer;
etching the preliminary channel region; and
annealing the etched preliminary channel region to form a FET channel region, the FET channel region having a substantially circular cross-sectional shape.

* * * * *